(12) United States Patent
Shimoji et al.

(10) Patent No.: US 11,964,342 B2
(45) Date of Patent: Apr. 23, 2024

(54) LASER PROCESSING APPARATUS

(71) Applicant: JSW AKTINA SYSTEM CO., LTD., Yokohama (JP)

(72) Inventors: Teruaki Shimoji, Tokyo (JP); Daisuke Ito, Tokyo (JP); Tatsuro Matsushima, Tokyo (JP); Ryo Shimizu, Tokyo (JP)

(73) Assignee: JSW AKTINA SYSTEM CO., LTD., Yokohama (JP)

( * ) Notice: Subject to any disclaimer, the term of this patent is extended or adjusted under 35 U.S.C. 154(b) by 327 days.

(21) Appl. No.: 17/594,127

(22) PCT Filed: Nov. 29, 2019

(86) PCT No.: PCT/JP2019/046882
§ 371 (c)(1),
(2) Date: Oct. 4, 2021

(87) PCT Pub. No.: WO2020/208862
PCT Pub. Date: Oct. 15, 2020

(65) Prior Publication Data
US 2022/0152733 A1 May 19, 2022

(30) Foreign Application Priority Data

Apr. 11, 2019 (JP) ................................ 2019-075288

(51) Int. Cl.
*B23K 26/08* (2014.01)
*B23K 26/073* (2006.01)
(Continued)

(52) U.S. Cl.
CPC ........ *B23K 26/083* (2013.01); *B23K 26/0732* (2013.01); *H01L 21/268* (2013.01); *H01L 21/67115* (2013.01); *B23K 2101/40* (2018.08)

(58) Field of Classification Search
CPC .............. B23K 26/083; B23K 26/0732; B23K 2101/40; H01L 21/268; H01L 21/67115
See application file for complete search history.

(56) References Cited

U.S. PATENT DOCUMENTS

| 5,902,497 A | * | 5/1999 | Alber | ................... | B23K 26/146 |
| | | | | | 219/121.84 |
| 2008/0041832 A1 | * | 2/2008 | Sykes | ................... | B23K 26/127 |
| | | | | | 219/121.84 |

(Continued)

FOREIGN PATENT DOCUMENTS

| JP | 2009-135430 A | 6/2009 |
| JP | 2014-14840 A | 1/2014 |

(Continued)

OTHER PUBLICATIONS

International Search Report from International Patent Application No. PCT/JP2019/046882, dated Feb. 10, 2020.

(Continued)

*Primary Examiner* — Nicole M Ippolito
(74) *Attorney, Agent, or Firm* — Potomac Law Group, PLLC

(57) ABSTRACT

A laser processing apparatus includes: a stage 2 capable of levitating and transporting a substrate 3 by jetting gas from a front surface; a laser oscillator configured to irradiate a laser beam 20a onto the substrate 3; and a gas jetting port arranged at a position overlapping a focus point position of the laser beam 20a in plan view, and being configured to jet inert gas. The front surface of the stage 2 is constituted by upper structures 5a and 5b, and the upper structures 5a and 5b are arranged so as to be spaced apart from each other and face each other. A gap between the upper structures 5a and 5b overlaps the focus point position of the laser beam 20a in plan view. A filling member 8 is arranged between the upper (Continued)

structures 5a and 5b so as to fill the gap between the upper structures 5a and 5b.

12 Claims, 22 Drawing Sheets

(51) Int. Cl.
  *H01L 21/26* (2006.01)
  *H01L 21/268* (2006.01)
  *H01L 21/67* (2006.01)
  *B23K 101/40* (2006.01)

(56) References Cited

U.S. PATENT DOCUMENTS

| | | |
|---|---|---|
| 2009/0111244 A1 | 4/2009 | Yamazaki et al. |
| 2009/0181552 A1 | 7/2009 | Shimomura et al. |
| 2018/0033664 A1 | 2/2018 | Fuji et al. |
| 2019/0189449 A1 | 6/2019 | Shimizu et al. |
| 2019/0193200 A1 | 6/2019 | Fuji et al. |
| 2021/0362273 A1* | 11/2021 | Suzuki ................ H01L 21/6776 |

FOREIGN PATENT DOCUMENTS

| | | |
|---|---|---|
| JP | 2016-162856 A | 9/2016 |
| JP | 2018-037431 A | 3/2018 |
| KR | 10-0603330 B1 | 7/2006 |
| KR | 10-2009-0079178 A | 7/2009 |
| WO | WO 2015/174347 A1 | 11/2015 |
| WO | WO 2018/066172 A1 | 4/2018 |
| WO | WO 2018/097087 A1 | 5/2018 |

OTHER PUBLICATIONS

Office Action dated Nov. 30, 2022, in Chinese Patent Application No. 201980094158.0.
Office Action issued Nov. 13, 2023, in Korean Patent Application No. 10-2021-7035243.

* cited by examiner

FIG. 2
(a)
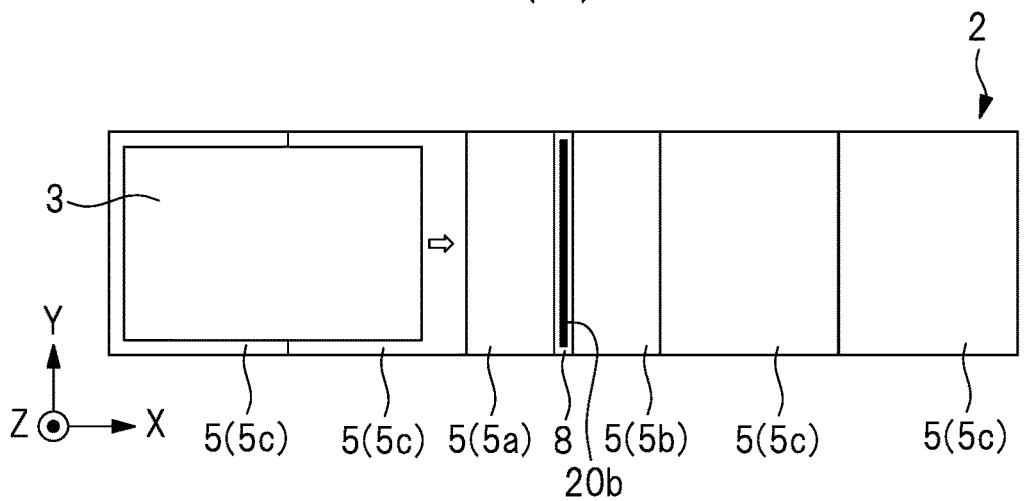
(b)
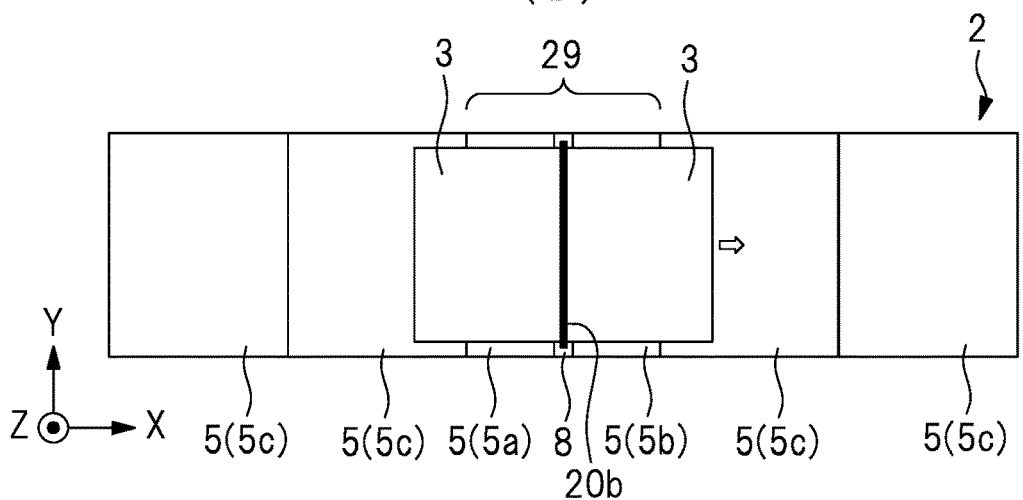
(c)
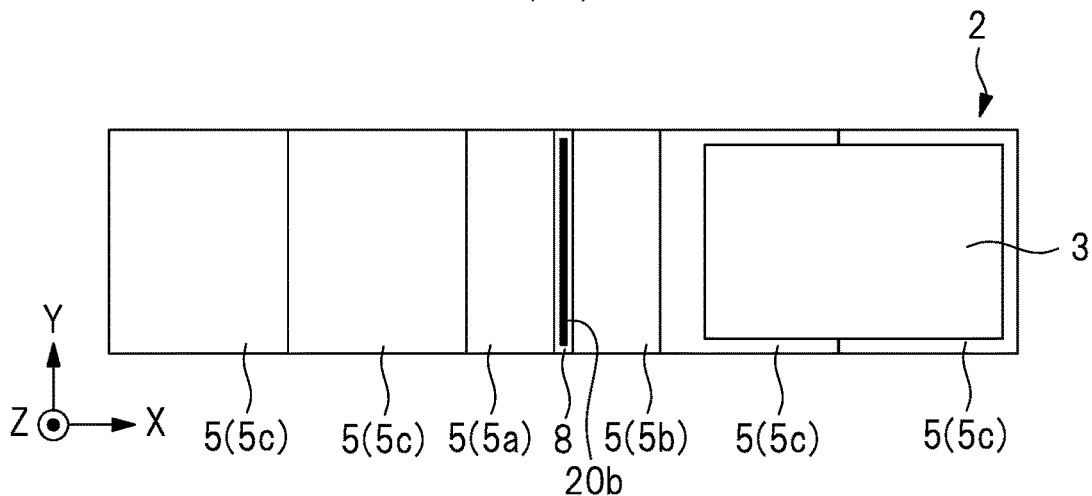

LASER PROCESSING APPARATUS

TECHNICAL FIELD

The present invention relates to a laser processing apparatus.

BACKGROUND ART

International Publication No. WO2015/174347 (Patent Document 1) describes a technique relating to a laser annealing apparatus that irradiates a laser beam onto an object-to-be-treated and performs an annealing process.

RELATED ART DOCUMENTS

Patent Documents

Patent Document 1: International Publication No. WO2015/174347

SUMMARY OF THE INVENTION

Problems to be Solved by the Invention

The present inventors have been studying a laser processing apparatus in which an object-to-be-treated is moved while the object-to-be-treated is levitated on a stage of the laser processing apparatus, and in which a laser is irradiated onto the moving object-to-be-treated. In such a laser processing apparatus, it is desirable to suppress or prevent variations in laser processing conditions for the object-to-be-treated.

Other problems and novel features of the present invention will be apparent from the description of the present specification and the accompanying drawings.

Means for Solving the Problem

According to one embodiment, the laser processing apparatus has a stage capable of levitating and transporting a substrate by jetting gas from a front surface, a laser oscillator configured to irradiate a laser beam onto the substrate, and a gas jetting port arranged at a position overlapping a focus point position of the laser beam in plan view, and being configured to jet inert gas. The front surface of the stage is constituted by a first upper structure and a second upper structure. The first upper structure and the second upper structure are arranged so as to be spaced apart from each other and face each other. A gap between the first upper structure and the second upper structure overlaps the focus point position of the laser beam in plan view, and a filling member is arranged between the first upper structure and the second upper structure so as to fill the gap.

Effects of the Invention

According to one embodiment, it is possible to suppress or prevent variations in the laser processing conditions for the object-to-be-treated.

BRIEF DESCRIPTIONS OF THE DRAWINGS

FIG. 2 is a plan view for describing an operation of the laser processing apparatus according to one embodiment;

DETAILED DESCRIPTION OF PREFERRED EMBODIMENTS

Hereinafter, an embodiment of the present invention will be described in detail with reference to the accompanying drawings. Note that, in all of the drawings used to described the embodiment, members having the same functions are denoted by the same reference signs, and redundant descriptions thereof will be omitted as appropriate. In addition, in the following embodiment, descriptions of the same or similar portions will not be repeated unless otherwise particularly necessary.

First Embodiment

<Overall Configuration of Laser Processing Apparatus>

Figure 1:
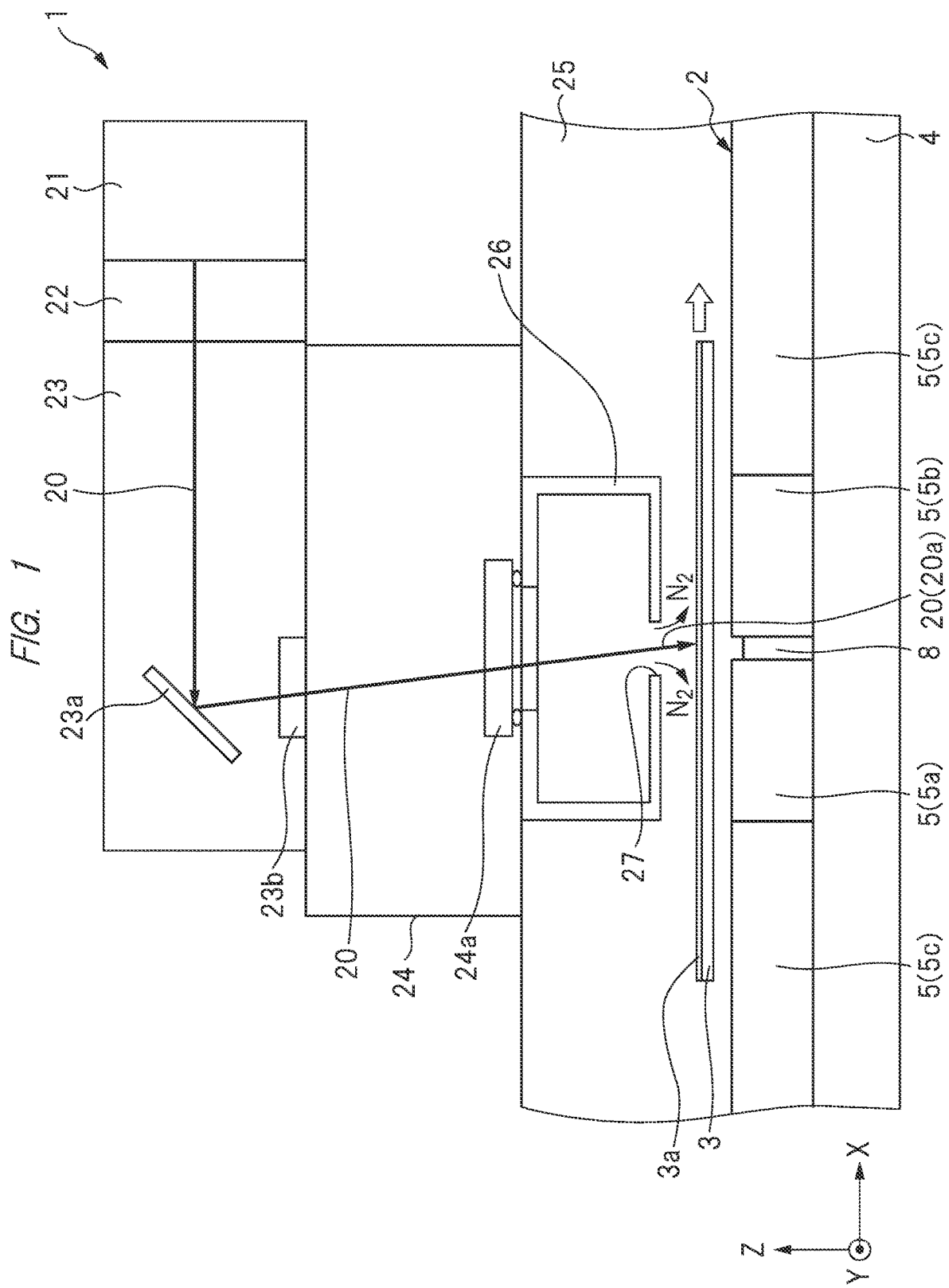
FIG. 1 is a cross-sectional view showing a schematic configuration of a laser processing apparatus according to one embodiment.

Hereinafter, an overall configuration of a laser processing apparatus 1 according to the present embodiment will be described with reference to FIG. 1. FIG. 1 is a cross-sectional view showing a schematic configuration of the laser processing apparatus 1 according to the present embodiment.

As shown in FIG. 1, the laser processing apparatus 1 according to the present embodiment comprises a laser beam generator 21, an optical attenuator 22, an optical system module 23, a sealed housing 24, and a processing chamber 25.

The laser beam generator (laser oscillator) 21 is constituted by a laser oscillator (laser beam source) that outputs a laser beam (such as an excimer laser beam), and the optical attenuator (attenuator) 22 for adjusting the output of the laser beam is arranged at an output destination of the laser beam generator 21. The optical attenuator 22 has a function for adjusting the output of the laser beam by adjusting a transmittance of the laser beam.

The optical system module 23 is arranged at a destination of the laser beam whose output is adjusted by the optical attenuator 22. The optical system module 23 is constituted by a reflecting mirror 23a, a lens (not shown) and the like, and has a function for forming the laser beam inputted from the optical attenuator 22 to the optical system module 23 into a line-beam laser beam. An output portion of the optical system module 23 is provided with a sealing window 23b that is translucent to the laser beam. The laser beam formed by the optical system module 23 is outputted from the optical system module 23 via the sealing window 23b.

The destination (in this case, a lower side of the optical system module 23) of the laser beam outputted from the optical system module 23 is provided with the sealed housing 24. An inner portion of the sealed housing 24 is a sealed space, and the laser beam travels through this sealed space. An output portion of the sealed housing 24 is provided with a sealing window 24a that is translucent to the laser beam.

The destination (in this case, a lower side of the sealed housing 24) of the laser beam outputted from the sealed housing 24 is provided with the processing chamber 25. A sealing box 26 connected to the sealing window 24a provided at the output portion of the sealed housing 24 is attached to the processing chamber 25. Inert gas represented by, for example, nitrogen gas is supplied to the sealing box 26. In addition, as shown in FIG. 1, an upper side of the sealing box 26 is sealed by the sealing window 24a provided in the sealed housing 24, while a lower side of the sealing box 26 is provided with an opening (gas jetting port) 27. For this reason, the inert gas (such as nitrogen gas) supplied to the sealing box 26 is jetted from the opening 27 to the lower side of the sealing box 26 (that is, toward a stage 2).

A stage 2 is arranged below the sealing box 26. The stage 2 is arranged below the sealing box 26 in the processing chamber 25. The stage 2 has an upper surface (front surface) and a back surface (lower surface) on an opposite side of the upper surface, and is a stage capable of levitating and transporting a substrate 3 by jetting gas from the upper surface (front surface). The substrate 3 made of, for example, glass or quartz can be arranged on the upper surface of the stage 2. This substrate 3 can be transported in a horizontal direction (specifically, an X direction) while being levitated on the stage 2 by the gas blowing out from the upper surface of the stage 2 (more specifically, from an upper surface of a plurality of upper structures 5 constituting the stage 2).

An amorphous semiconductor film, more specifically, an amorphous silicon film 3a, is formed on the front surface (upper surface) of the substrate 3. The inert gas (such as nitrogen gas) jetted (discharged) from the opening 27 provided in the sealing box 26 is sprayed onto the amorphous silicon film 3a formed on the front surface of the substrate 3.

As described below, the amorphous semiconductor film (in this case, the amorphous silicon film 3a) formed on the substrate 3 is transformed (changed) into a polycrystalline semiconductor film (in this case, a polycrystalline silicon film) by laser processing (laser annealing process) using the laser processing apparatus 1. Hereinafter, the present embodiment will be described as though the amorphous semiconductor film formed on the front surface of the substrate 3 is the amorphous silicon film 3a. The substrate 3 on which the amorphous semiconductor film (amorphous silicon film 3a) is formed can be regarded as an object-to-be-treated.

The stage 2 has a surface plate (base member) 4 and a plurality of upper structures (substrate-levitating structures, stage members, substrate-levitating stage members, levitating units) 5. Upper surfaces of the plurality of upper structures 5 constitutes the upper surface of the stage 2. For this reason, the plurality of upper structures 5 are arranged side by side in the horizontal direction without being stacked on one another, and the plurality of upper structures 5 constitute an upper portion of the stage 2. The plurality of upper structures 5 are arranged side by side and supported on the surface plate 4.

Note that FIG. 1 shows a case where not only upper structures 5a and 5b described below but also upper structures 5c other than the upper structures 5a and 5b are arranged on the common surface plate 4. However, as another embodiment, it is possible to have a configuration in which the upper structures 5c are not mounted on the surface plate 4 but are supported by using a member different from the surface plate 4 on which the upper structures 5a and 5b are arranged. Note that, even in such a case, it is preferable to arrange the upper structures 5a and 5b and a filling member 8 between the upper structures 5a and 5b on the common surface plate 4. The surface plate 4 on which the upper structures 5a and 5b are mounted can be made of, for example, a stone material (such as granite), while the member supporting the upper structures 5c can be made of, for example, a metal material.

Each of the upper structures 5 is configured such that gas can be jetted from its upper surface (front surface). Namely, gas is jetted from the upper surface (front surface) of each of the upper structures 5, and the substrate 3 can be levitated by the jetted gas. For this reason, each of the upper structures 5 is a structure (member) that acts to levitate the substrate 3 by jetting the gas from its upper surface (front surface), that is, each of the upper structures 5 is a substrate-levitating structure.

Specifically, a plurality of (several) minute holes are present in the upper surface (front surface) of each of the upper structures 5, and the gas can be jetted from these minute holes. When the substrate 3 is moved while being levitated on the stage 2, the upper surface (front surface) of each of the upper structures 5 faces the lower surface of the substrate 3, and the gas (hereinafter also referred to as substrate-levitating gas) jetted from the plurality of (several) minute holes in the upper surface (front surface) of each of the upper structures 5 hits the lower surface of the substrate 3 and acts to levitate the substrate 3.

Next, an operation of the laser processing apparatus 1 will be described with reference to FIGS. 1 and 2. FIG. 2 is a plan view for describing the operation of the laser processing apparatus 1, and shows the stage 2 of the laser processing apparatus 1 and the substrate 3 which is transported while being levitated on the stage 2.

In FIG. 1, a laser beam 20 outputted from the laser beam generator (laser oscillator) 21 has an optical output adjusted by the optical attenuator 22, and then is inputted to the optical system module 23. The laser beam 20 inputted to the optical system module 23 is formed into a line-beam shape (rectangular shape) by a lens system provided inside the optical system module 23. The laser beam 20 formed into a line-beam shape is reflected by, for example, the reflecting mirror 23a arranged inside the optical system module 23, and then enters the sealed housing 24 from the sealing window 23b. The laser beam 20 that entered the sealed housing 24 travels through an inner space of the sealed housing 24, and then enters the sealing box 26 provided in the processing chamber 25 from the sealing window 24a. Then, the laser beam 20 that entered the sealing box 26 passes through the opening 27 provided in the sealing box 26, and travels toward the stage 2. Here, the laser beam 20 that passes through the opening 27 of the sealing box 26 and travels toward the stage 2 (substrate 3) is referred to as a laser beam 20a. The laser beam 20a is irradiated onto the substrate 3 (more specifically, the amorphous silicon film 3a on the substrate 3) that is moved while being levitated on the stage 2. A laser beam irradiated region in the amorphous silicon film 3a is locally heated and is changed (transformed) into a polycrystalline silicon film (polysilicon film).

The laser beam 20a is formed into a line-beam shape with a Y direction as a long axis direction (longitudinal direction). In FIG. 2 and in FIGS. 3 and 25 described below, the region (planar region) where the laser beam 20a can be irradiated is shown as a laser beam irradiated region 20b. The laser beam irradiated region 20b has a rectangular shape having a long axis (long side) and a short axis (short side), the long axis (long side) being larger than the short axis (short side), a long axis (long side) direction being the Y direction, and a short axis (short side) direction being the X direction. Namely, a planar shape of the laser beam 20a on the front surface (upper surface) of the stage 2 has a rectangular shape having the long axis (long side) and the short axis (short side), the long axis (long side) direction being the Y direction, and the short axis (short side) direction being the X direction. From another viewpoint, the planar shape of the laser beam 20a that is irradiated onto the substrate 3 (amorphous silicon film 3a) has a rectangular shape having the long axis (long side) and the short axis (short side), the long axis (long side) direction being the Y direction and the short axis (short side) direction being the X direction. In other words, the planar shape of the laser beam 20a on the front surface of the substrate 3 (amorphous silicon film 3a) or on the front surface of the stage 2 has a rectangular shape having the long axis (long side) and the short axis (short side), the long axis (long side) direction being the Y direction. A length of the long side (length in the Y direction) of the laser beam irradiated region 20b can be, for example, about the same as a length of the substrate 3 in the Y direction. On the other hand, a length of the short side (length in the X direction) of the laser beam irradiated region 20b is significantly smaller than a length of the substrate 3 in the X direction.

Here, the X direction and the Y direction are directions intersecting each other, and are preferably directions orthogonal to each other. In addition, the X direction and the Y direction are substantially parallel to the upper surface of the stage 2, and thus are substantially parallel to the upper surface of the substrate 3 that is moved while being levitated on the stage 2.

When laser processing is performed on the substrate 3, the stage 2 itself does not move, but the substrate 3 is transported (moved) in the X direction while being levitated on the fixed stage 2. Namely, the substrate 3 shifts from a state shown in (a) of FIG. 2 to a state shown in (b) of FIG. 2 and to a state shown in (c) of FIG. 2 in this order. In FIG. 2, (a) corresponds to a time prior to movement of the substrate 3, (b) corresponds to a time during movement of the substrate 3, and (c) corresponds to a time at the end of movement of the substrate 3. The substrate 3 arranged on the stage 2 can be levitated from the stage 2 by the gas jetted from the upper surface of the stage 2 (that is, the upper surface of the plurality of upper structures 5 constituting the stage 2). Then, the substrate 3 is grasped by a substrate-transporting robot arm (not shown) or the like and is moved in the X direction such that the substrate 3 levitated on the stage 2 is moved in the X direction.

When laser processing is performed on the substrate 3, the stage 2 itself does not move, nor does an irradiation position of the laser beam 20. For this reason, the irradiation position of the laser beam 20a on the stage 2 is fixed. Namely, the laser beam irradiated region 20b as seen from the stage 2 is fixed. However, as the substrate 3 is moved in the X direction while being levitated on the stage 2, the irradiation position (irradiated region) of the laser beam 20a on the substrate 3 (amorphous silicon film 3a) is moved with the movement of the substrate 3. Namely, as the substrate 3 is moved with respect to the stage 2 and to the laser beam 20a whose positions are fixed positions, the irradiation position (irradiated region) of the laser beam 20a on the substrate 3 (amorphous silicon film 3a) is moved with the movement of the substrate 3. As a result, the laser beam irradiated region of the amorphous silicon film 3a can be scanned, and the entire amorphous silicon film 3a can be irradiated with the laser beam 20a. Note that the laser beam 20 can be a continuous laser beam, or can be a pulsed laser beam of a predetermined frequency.

In addition, the inert gas (such as nitrogen gas) is supplied to the sealing box 26, and this inert gas is jetted (discharged or exhausted) from the opening 27 provided in a lower portion of the sealing box 26. Then, the inert gas jetted from the opening 27 provided in the sealing box 26 is sprayed onto the upper surface of the substrate 3 (more specifically, the amorphous silicon film 3a on the substrate 3) that is moved in the X direction while being levitated on the stage 2. For this reason, the opening 27 provided in the sealing box 26 can be regarded as a gas jetting port for jetting the inert gas.

The inert gas is sprayed from the opening 27 in the sealing box 26 onto the amorphous silicon film 3a on the substrate 3 to prevent an unnecessary reaction from occurring when the laser beam is irradiated onto the amorphous silicon film 3a on the substrate 3 and the amorphous silicon film 3a is changed into a polycrystalline silicon film (that is, to prevent an oxidized silicon film from forming on the front surface of the polycrystalline silicon film). Namely, the inert gas is sprayed from the opening 27 in the sealing box 26 such that the laser beam is irradiated onto the amorphous silicon film 3a in an atmosphere of the inert gas jetted from the opening 27 in the sealing box 26 and the amorphous silicon film 3a is changed into a polycrystalline silicon film.

In other words, while the substrate 3 is levitated on the stage 2 and moved in the X direction, the inert gas (such as nitrogen gas) is sprayed onto the amorphous silicon film 3a formed on the front surface of the substrate 3, and at the same time, the laser beam 20a formed into a line-beam shape is irradiated onto the amorphous silicon film 3a. As a result, the amorphous silicon film 3a formed on the substrate 3 is locally heated, and this allows the laser beam irradiated region of the amorphous silicon film 3a to be scanned while the laser beam irradiated region of the amorphous silicon film 3a is changed into a polycrystalline silicon film. In this manner, laser processing (laser annealing process) can be performed on the entire amorphous silicon film 3a, and the entire amorphous silicon film 3a can be changed into a polycrystalline silicon film. In other words, the amorphous semiconductor film (in this case, the amorphous silicon film 3a) formed on the substrate 3 can be transformed (changed) into a polycrystalline semiconductor film (in this case, a polycrystalline silicon film).

Thus, when laser processing is performed using the laser processing apparatus 1, the substrate 3 is transported while being levitated on the stage 2, the inert gas is jetted from the opening 27 in the sealing box 26, and the laser beam 20a is irradiated onto the substrate 3 (amorphous silicon film 3a).

<Detailed Configuration of Laser Processing Apparatus>

Next, a detailed configuration of the stage 2 of the laser processing apparatus 1 according to the present embodiment will be described with reference to FIGS. 3 to 5.

Figure 3:
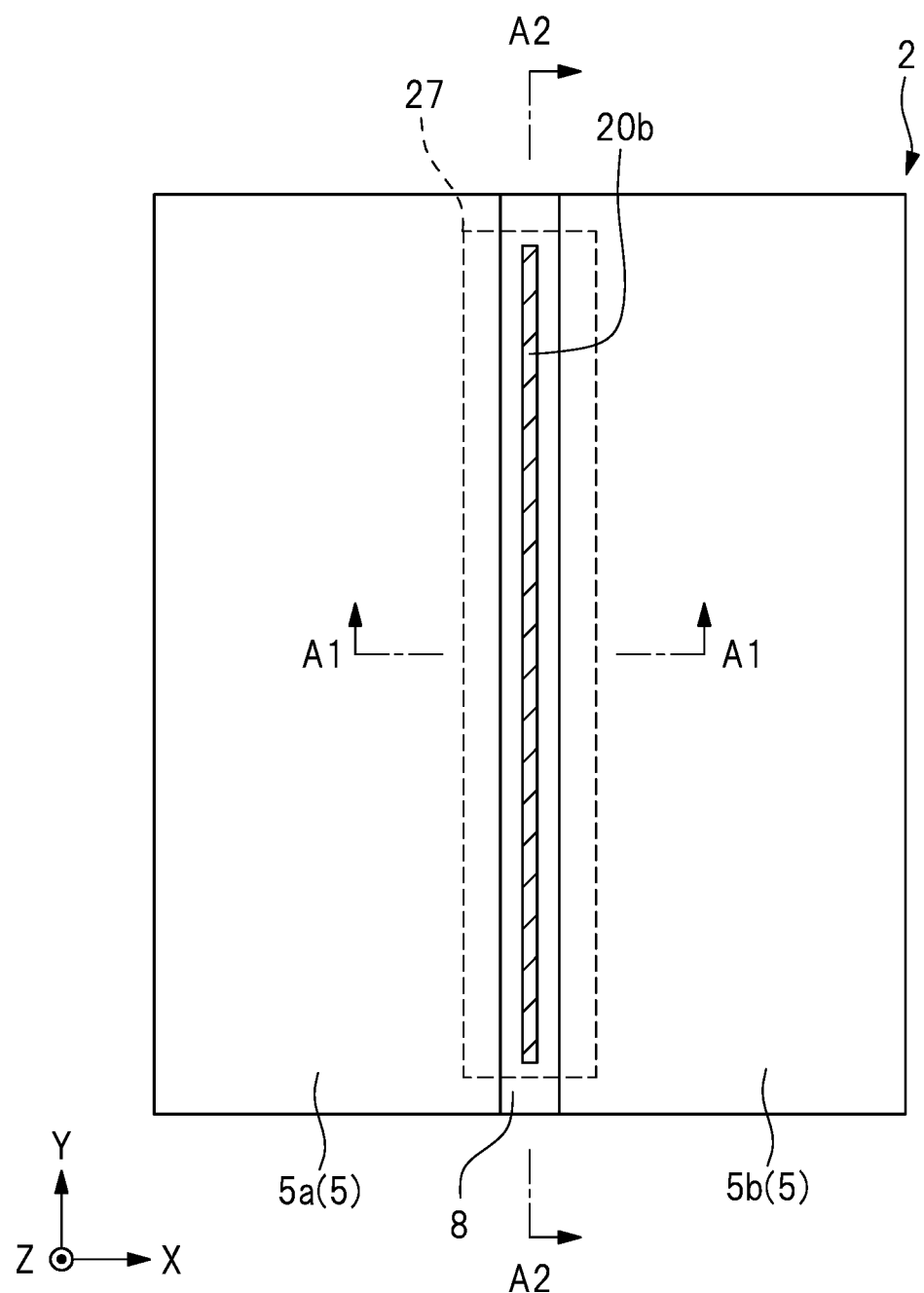
FIG. 3 is a plan view of a main portion of the laser processing apparatus according to one embodiment.
Figure 4:
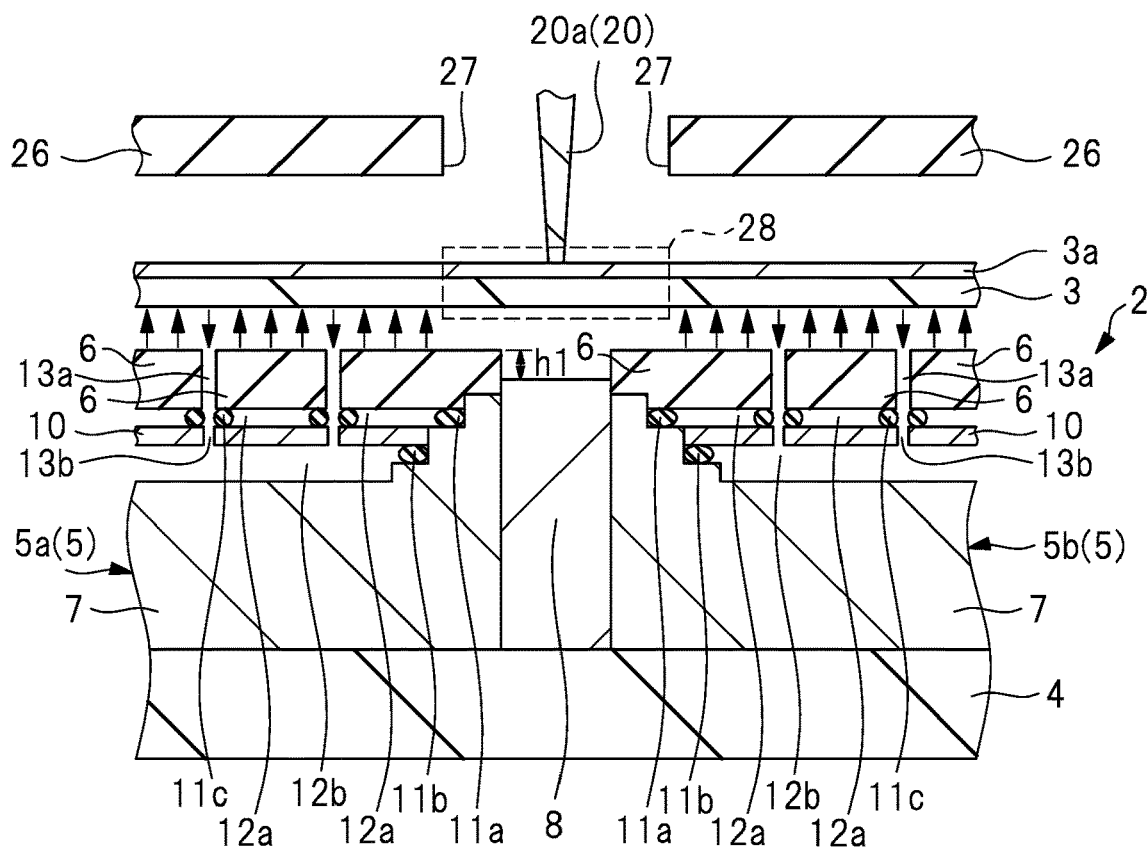
FIG. 4 is a cross-sectional view of a main portion of the laser processing apparatus according to one embodiment.
Figure 5:
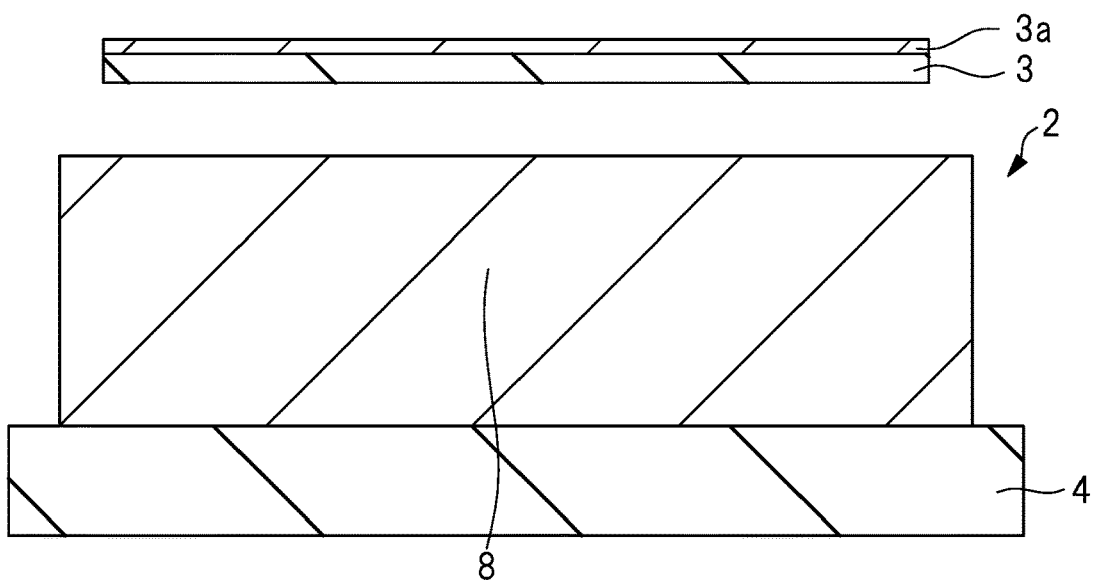
FIG. 5 is a cross-sectional view of a main portion of the laser processing apparatus according to one embodiment.

FIG. 3 is a plan view of a main portion of the laser processing apparatus 1 of the present embodiment, and FIGS. 4 and 5 are cross-sectional views of the main portion of the laser processing apparatus 1 of the present embodiment. FIG. 3 shows a partial plan view of the stage 2 of the laser processing apparatus 1 of the present embodiment, and the planar region shown in FIG. 3 substantially corresponds to a region 29 in (b) of the above-described FIG. 2. Note that, in FIG. 3, the laser beam irradiated region 20b is indicated by hatched lines. FIG. 4 substantially corresponds to a cross-sectional view taken at a position along a line A1-A1 shown in FIG. 3, and FIG. 5 substantially corresponds to a cross-sectional view taken at a position along a line A2-A2 shown in FIG. 3. In addition, although the cross-sectional view of FIG. 4 shows the laser beam 20a, the cross-sectional view of FIG. 5 does not show the laser beam 20a since the laser beam 20a is irradiated onto the entire upper surface of the amorphous silicon film 3a.

As described above, the stage 2 of the laser processing apparatus 1 of the present embodiment has the surface plate 4 and the plurality of upper structures 5 arranged on the surface plate 4. The upper surface (front surface) of the stage 2 is constituted by the plurality of upper structures 5, that is, the upper surface (front surface) of each of the plurality of upper structures 5 constitutes the upper surface of the stage 2. Each of the plurality of upper structures 5 of the stage 2 can act to jet the gas from the upper surface (front surface) and levitate the substrate 3 by the jetted gas. The stage 2 of the laser processing apparatus 1 of the present embodiment further has the filling member 8.

The plurality of upper structures 5 constituting the stage 2 includes the upper structures 5a and 5b adjacent to each other in the X direction so as to sandwich the laser beam irradiated region 20b in plan view (see FIGS. 2 and 3). The upper structure 5a and the upper structure 5b are arranged so as to be spaced apart from each other in the X direction and face each other. Therefore, the upper structure 5a and the upper structure 5b are arranged so as to have a predetermined spacing in the X direction, and the filling member 8 is arranged between the upper structure 5a and the upper structure 5b in the X direction. Namely, the upper structure 5a and the upper structure 5b are adjacent to each other in the X direction with the filling member 8 interposed therebetween, and the filling member 8 is arranged between side surfaces of the upper structure 5a and the upper structure 5b facing each other. The upper structures 5a and 5b and the filling member 8 arranged between the upper structures 5a and 5b are arranged (mounted) on the upper surface of the surface plate 4. The filling member 8 can be attached to the upper structure 5a or the upper structure 5b by using a screw or the like. The filling member 8 is a member for closing (filling) a gap between the upper structure 5a and the upper structure 5b. For this reason, the filling member 8 is arranged so as to fill the gap between the upper structure 5a and the upper structure 5b. It is preferable that the upper structures 5a and 5b are in contact with the filling member 8 between the upper structures 5a and 5b. Unlike the upper structures 5, the filling member 8 does not jet the gas for levitating the substrate 3 (substrate-levitating gas), and thus is not a member that acts to levitate the substrate 3. Since there are no other upper structures 5 arranged between the upper structure 5a and the upper structure 5b adjacent to each other in the X direction so as to sandwich the filling member 8, the gas for levitating the substrate 3 (substrate-levitating gas) is not jetted in a region between a structure of the upper structure 5a and the upper structure 5b.

Since the filling member 8 is arranged between the upper structure 5a and the upper structure 5b so as to fill the gap between the upper structure 5a and the upper structure 5b, the filling member 8 can act to prevent the inert gas jetted from the opening 27 in the sealing box 26 from flowing to a side lower than (below) the filling member 8 in the gap between the upper structure 5a and the upper structure 5b. Namely, since the filling member 8 is present between the upper structure 5a and the upper structure 5b, it is possible to prevent the inert gas jetted from the opening 27 in the sealing box 26 from flowing below the filling member 8 (more specifically, below the upper surface of the filling member 8).

The filling member 8 is made of, for example, a metal material. It is possible to use, for example, stainless steel (SUS) or the like as a material of the filling member 8. In addition, the filling member 8 has, for example, a plate-like outer shape so that it can be arranged between the upper structures 5a and 5b. For this reason, the filling member 8 can be formed by processing a plate-like metal member (metal plate).

The structure of the upper structure 5a and the structure of the upper structure 5b are basically the same. Therefore, the structure of the upper structure 5a will be described here, and descriptions regarding the structure of the upper structure 5a can be applied to the structure of the upper structure 5b.

The upper structure 5a has a surface-side member 6 and a base portion (pedestal portion) 7, and the surface-side member 6 is arranged and supported on the base portion 7. The upper surface (front surface) of the surface-side member 6 constitutes the upper surface (front surface) of the upper structure 5a, and thus partially constitutes the upper surface (front surface) of the stage 2.

The surface-side member 6 is preferably made of a porous body (porous material). The porous body has several minute pores. Examples of the porous body include porous carbon, porous ceramics, porous metal and the like. In addition, the surface-side member 6 can be a plate-like member. For this reason, a porous plate (plate-like member made of the porous body) can be suitably used as the surface-side member 6, in which case the gas for levitating the substrate 3 can be jetted from the upper surface of the porous plate via the several pores of the porous plate. In this case, the pores of the porous plate correspond to the above-described "minute holes" in the upper surface of the upper structure 5a.

The base portion 7 can be made of a metal material, and preferably can be made of aluminum or an aluminum alloy. It is possible to use, for example, a processed plate-like member (metal plate) for the base portion 7. In addition, the surface plate 4 has a flat upper surface, and the upper structures 5a and 5b and the filling member 8 are arranged on the upper surface of the surface plate 4. An outer shape of each of the upper structures 5a and 5b can be, for example, a substantially rectangular body.

The upper structure 5a includes a structure for jetting the substrate-levitating gas from the upper surface of the upper structure 5a (surface-side member 6), and specifically includes the following structure.

As shown in FIG. 4, the upper structure 5a has the base portion 7, the surface-side member 6, and an intermediate plate 10 arranged between the base portion 7 and the surface-side member 6. The intermediate plate 10 can be a plate-like member that is thinner than the base portion 7, and can be made of, for example, a metal material (such as aluminum). In the upper structure 5a, the intermediate plate 10 is adhered and fixed onto the base portion 7 via an adhesive layer (adhesive material) 11b, and the surface-side member 6 is adhered and fixed onto the base portion 7 via an adhesive layer (adhesive material) 11a. In the upper structure 5a, the intermediate plate 10 is arranged between the base portion 7 and the surface-side member 6, a space (pressurized space) 12a is provided between the surface-side member 6 and the intermediate plate 10, and a space (depressurized space) 12b is provided between the base portion 7 and the intermediate plate 10. The space 12a is surrounded by the intermediate plate 10, the surface-side member 6 and the adhesive layer 11a, and the space 12b is surrounded by the base portion 7, the intermediate plate 10 and the adhesive layer 11b.

A plurality of (several) through holes 13b are provided in the intermediate plate 10, and a plurality of (several) through holes 13a are provided in the surface-side member 6 at positions matching the through holes 13b in the intermediate plate 10. A periphery of each of the through holes 13a in a lower surface of the surface-side member 6 is adhered to a periphery of each of the through holes 13b in an upper surface of the intermediate plate 10 via an annular adhesive layer 11c. For this reason, each of the through holes 13a in the surface-side member 6 is linked to each of the through holes 13b in the intermediate plate 10 via a space in the annular adhesive layer 11c. For this reason, the surface-side member 6 made of the porous body (porous plate) has the plurality of (several) mechanically formed through holes 13a in addition to the pores of the porous body itself. Preferably, in consideration of processability, the through holes 13a (diameter) are larger than the pores (diameter) of the porous body.

Pressurized gas is introduced into the space 12a via a through hole (not shown) or the like provided in the base portion 7. The pressurized gas introduced into the space 12a passes through the plurality of minute holes (pores constituting the porous body) of the surface-side member 6 and is jetted from the upper surface of the surface-side member 6, and the substrate 3 is levitated by the jetted gas. The gas jetted from the upper surface of the surface-side member 6 is schematically indicated by upward arrows in FIG. 4. Inert gas represented by, for example, nitrogen gas can be used as the gas that is jetted from the upper surface of the surface-side member 6. Then, the space 12b is depressurized via a through hole (not shown) or the like provided in the base portion 7, and thus, the gas on the surface-side member 6 is sucked into the space 12b via the through holes 13a in the surface-side member 6, the space in the annular adhesive layer 11c, and the through holes 13b in the intermediate plate 10. In FIG. 4, the gas sucked from the upper surface of the surface-side member 6 (through holes 13a) is schematically indicated by downward arrows.

For this reason, the gas is jetted from the minute holes in the surface-side member 6 (in this case, the pores constituting the porous body) to levitate the substrate 3 while the gas on the surface-side member 6 is sucked from the through holes 13a in the surface-side member 6 to suction the substrate 3. For this reason, a height position of the substrate 3 to be levitated can be controlled with high precision by adjusting the jetting and sucking of the gas from the surface-side member 6.

Here, a case where a structure for performing the jetting and sucking of the gas from the upper surfaces of the upper structures 5a and 5b is formed by using the intermediate plate 10, the adhesive layers 11a, 11b and 11c, the spaces 12a and 12b, the through holes 13a and 13b and the like has been described as an example. However, the structure is not limited to such a configuration. The upper structures 5a and 5b may have a structure for performing the jetting and sucking of the gas (substrate-levitating gas) from its upper surface.

The laser beam 20a is irradiated onto the substrate 3 (more specifically, the amorphous silicon film 3a formed on the substrate 3), or if there is no substrate 3 or amorphous silicon film 3a, the laser beam 20a is irradiated onto the region between the upper structure 5a and the upper structure 5b (that is, the filling member 8). Namely, the laser beam 20a travels toward the region between the upper structure 5a and the upper structure 5b. For this reason, the laser beam irradiated region 20b (region where the laser beam 20a is irradiated) in the substrate 3 (amorphous silicon film 3a) is located above the region between the upper structure 5a and the upper structure 5b (that is, above the filling member 8), and overlaps the region between the upper structure 5a and the upper structure 5b (that is, the filling member 8) in plan view. For this reason, the gap (filling member 8) between the upper structure 5a and the upper structure 5b overlaps the focus point position of the laser beam 20a in plan view.

The opening 27 as the gas jetting port is arranged above the stage 2. Further, the opening 27 as the gas jetting port is arranged at a position overlapping the focus point position of the laser beam 20a in plan view. Namely, the opening 27 overlaps the laser beam irradiated region 20b in plan view. It is more preferable that the laser beam irradiated region 20b is enclosed by the opening 27 in plan view. The reason for this is to make the vicinity of the laser beam irradiated region 20b into an inert gas atmosphere and allow the laser beam 20a to be irradiated onto the substrate 3 (amorphous silicon film 3a) in the atmosphere of the inert gas jetted (discharged) from the opening 27 in the sealing box 26.

For this reason, the opening 27 as the gas jetting port overlaps the gap (filling member 8) between the upper structure 5a and the upper structure 5b in plan view. Namely, the opening 27 at least partially overlaps the gap (filling member 8) between the upper structure 5a and the upper structure 5b in plan view.

In addition, the opening 27 as the gas jetting port is arranged above the stage 2 in the processing chamber 25, and is arranged below (at a position lower than) the laser beam generator 21, the optical attenuator 22, the optical system module 23 and the sealed housing 24.

<Background of Studies>

Figure 6:
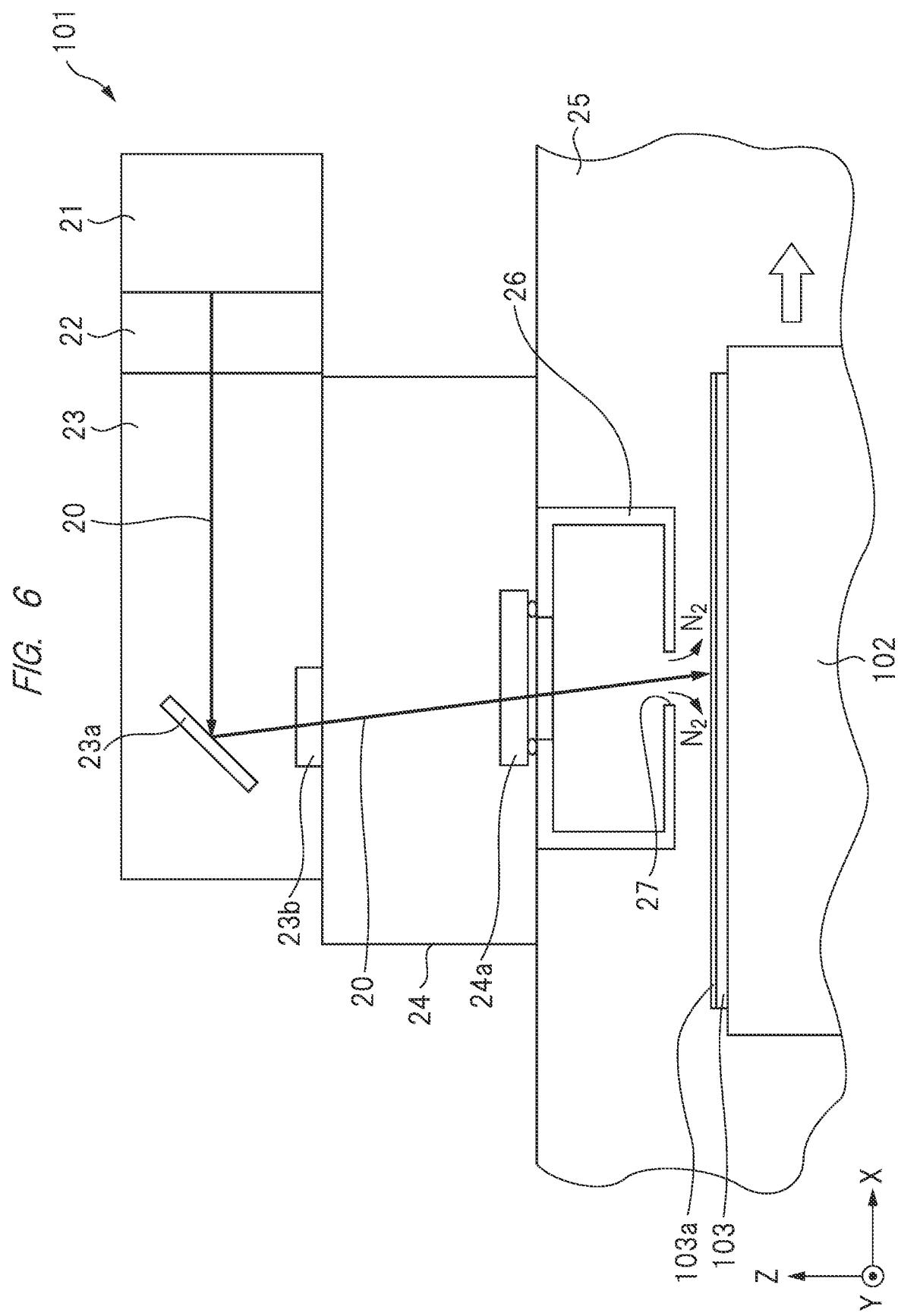
FIG. 6 is a cross-sectional view showing a schematic configuration of the laser processing apparatus of a first study example.

FIG. 6 is a cross-sectional view showing a schematic configuration of a laser processing apparatus 101 of a first study example studied by the present inventors, and is a drawing corresponding to the above-described FIG. 1.

In the laser processing apparatus 101 of the first study example shown in FIG. 6, a substrate 103 corresponding to the above-described substrate 3 is arranged on a stage 102 so as to be in contact with the stage 102, and the stage 102 is moved such that the laser beam 20 is irradiated onto the substrate 103 while the substrate 103 is being moved together with the stage 102. Namely, in the laser processing apparatus 101 of the first study example, the substrate 103 is not moved while being levitated on the stage 102 but is arranged and fixed on the stage 102, and the stage 102 and the substrate 103 are moved together. The substrate 103 is moved together with the stage 102 such that the laser beam irradiated region in an amorphous silicon film 103a formed on the substrate 103 can be scanned, and the entire amorphous silicon film 103a can be changed into a polycrystalline silicon film.

However, in the laser processing apparatus 101 of the first study example, since it is necessary to move the stage 102 together with the substrate 103, after laser processing is performed on the substrate 103, the stage 102 that has been moved to an end position of the laser processing needs to be returned to an initial position. Then, it is necessary to arrange the next substrate 103 on the stage 102 and then perform laser processing on the substrate 103 while moving the stage 102 together with the substrate 103. In this case, since an operation is necessary to remove the laser processed substrate 103 from the stage 102 and then move the stage 102 back to the initial position, when laser processing is performed on the plurality of substrates 103, processing time per substrate 103 would become longer and a throughput would become lower.

Therefore, the present inventors have been studying a case where the substrate is moved in the horizontal direction while the substrate is levitated on the stage of the laser processing apparatus, and the laser beam is irradiated onto the moving substrate. In this case, since the stage does not need to be moved when laser processing is performed on the plurality of substrates, processing time per substrate becomes shorter and the throughput becomes higher.

Figure 7:
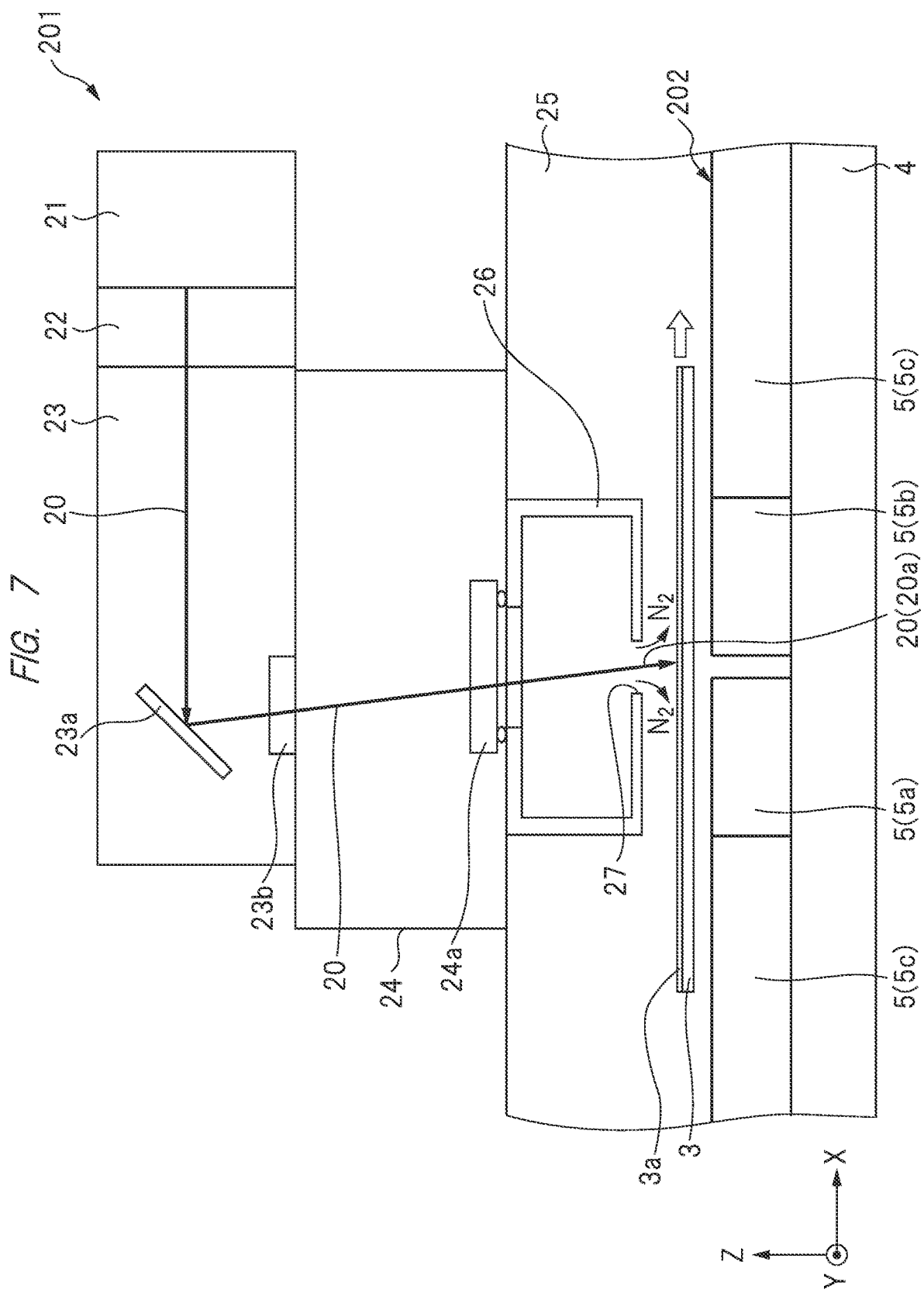
FIG. 7 is a cross-sectional view showing a schematic configuration of the laser processing apparatus of a second study example.
Figure 8:
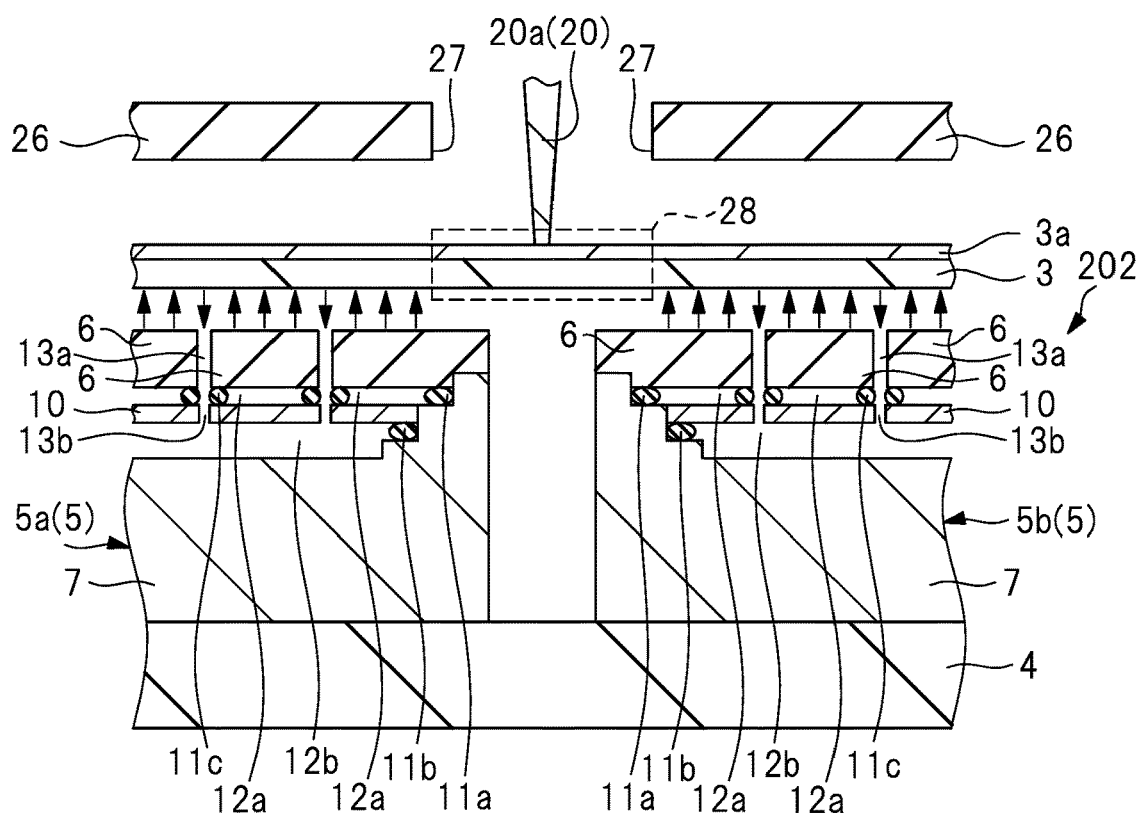
FIG. 8 is a cross-sectional view of a main portion of the laser processing apparatus of the second study example.

FIG. 7 is a cross-sectional view showing a schematic configuration of a laser processing apparatus 201 of a second study example studied by the present inventors, and is a drawing corresponding to the above-described FIG. 1. FIG. 8 is a cross-sectional view of a main portion of the laser processing apparatus 201 of the second study example, and is a drawing corresponding to the above-described FIG. 4.

The laser processing apparatus 201 of the second study example (FIGS. 7 and 8) differs from the laser processing apparatus 1 of the present embodiment (FIGS. 1 and 4) in that the stage 2 of the laser processing apparatus 1 of the present embodiment (FIGS. 1 and 4) has the above-described filling member 8, whereas a stage 202 of the laser processing apparatus 201 of the second study example (FIGS. 7 and 8) does not have a component corresponding to the above-described filling member 8. Namely, in the stage 202 of the laser processing apparatus 201 of the second study example, there is no component corresponding to the above-described filling member 8 arranged between the upper structure 5a and the upper structure 5b.

First, a reason why the upper structure 5a and the upper structure 5b are spaced apart from each other in the laser processing apparatus 201 of the second study example shown in FIGS. 7 and 8 and in the laser processing apparatus 1 of the present embodiment (FIGS. 1 and 4) will be described.

In the laser processing apparatus 201 of the second study example (FIGS. 7 and 8) and the laser processing apparatus 1 of the present embodiment (FIGS. 1 and 4), the substrate 3 is moved in the horizontal direction while being levitated on the fixed stage (2, 202), and the laser beam 20a is irradiated onto the moving substrate 3. As a result, the laser beam irradiated region of the amorphous silicon film 3a formed on the substrate 3 can be scanned, and the entire amorphous silicon film 3a can be changed into a polycrystalline silicon film.

However, in the laser processing apparatus 201 of the second study example (FIGS. 7 and 8) and the laser processing apparatus 1 of the present embodiment (FIGS. 1 and 4), moving the substrate 3 with the stage (2, 202) fixed causes the laser beam irradiation position on the substrate 3 viewed from the stage (2, 202) to be fixed, and there is a risk that the stage (2, 202) is locally heated.

Namely, in FIGS. 4 and 7, the substrate 3 and the amorphous silicon film 3a on the substrate 3 are locally heated in the region where the laser beam 20a is irradiated and in its vicinity, and thus, a region 28 (hereinafter referred to as substrate-heated region 28) surrounded by a dotted line is locally heated to a significantly high temperature. Since the laser beam is irradiated while the substrate 3 is being moved, in the substrate 3 and the amorphous silicon film 3a on the substrate 3, the substrate-heated region 28 is moved together with the movement of the substrate 3. However, since the stage (2, 202) is fixed, the position of the substrate-heated region 28 is not moved but is fixed when viewed from the stage (2, 202). For this reason, while laser processing is being performed on the substrate 3, a region located below the substrate-heated region 28 in the stage (2, 202) would be fixed.

Therefore, since the region located below the substrate-heated region 28 and its vicinity in the stage (2, 202) would be continuously heated by heat transmitted from the substrate-heated region 28 while laser processing is being performed on the substrate 3, the heat transmitted from the substrate-heated region 28 accumulates and causes local heating and an increase in the local temperature. If the stage (2, 202) is locally heated and the local temperature increases, thermal distortion (distortion caused by heat) may occur in the stage (2, 202), causing deformation of the stage (2, 202).

Since the height position of the substrate 3 that is levitated on the stage (2, 202) would vary if the stage (2, 202) is locally deformed, variations in laser processing conditions for the substrate 3 may occur. Namely, since the substrate 3 is moved while being levitated on the stage (2, 202), if the stage (2, 202) is deformed, the height position of the substrate 3 being levitated on the stage (2, 202) would change. If the height position of the substrate 3 changes, a distance between the substrate 3 and the focus point position of the laser beam irradiated onto the substrate 3 would also change, causing variations in the laser processing conditions for the substrate 3.

For example, even if the height position of the substrate 3 that is levitated on the stage (2, 202) is aligned with the focus point position of the laser beam 20a before the stage (2, 202) is deformed by thermal distortion, if the stage (2, 202) is deformed by heat conduction from the substrate-heated region 28, the height position of the substrate 3 that is levitated on the stage (2, 202) would deviate from the focus point position of the laser beam 20a. This leads to variations in the laser processing conditions for the substrate 3 before and after the stage (2, 202) is locally deformed by the thermal distortion.

If the laser processing conditions for the substrate 3 vary before and after deformation of the stage (2, 202) by thermal distortion, this may lead to variations in characteristics of the polycrystalline silicon film in a case where the amorphous silicon film 3a formed on the substrate 3 is changed into the polycrystalline silicon film by laser processing. For example, there is a risk of variations in a crystallization state of the polycrystalline silicon film. For this reason, in order to suppress variations in characteristics of the polycrystalline silicon film formed on one substrate 3 and variations in characteristics between the polycrystalline silicon film formed on the plurality of substrates 3, it is desirable to suppress deformation of the stage (2, 202) by heat conduction from the substrate-heated region 28.

Here, unlike the first study example (FIGS. 7 and 8) and the present embodiment (FIGS. 1 and 4), a configuration in which the upper structure 5a and the upper structure 5b are in contact and are integrated with each other is also considered. However, in such a case, the upper structure of the stage also is present just below the laser beam irradiated region in the substrate 3 (amorphous silicon film 3a), that is, just below the substrate-heated region 28, and heat is easily transmitted from the substrate-heated region 28 to the upper structure of the stage. For this reason, there is a concern that the upper structure (particularly corresponding to the surface-side member 6) present just below the substrate-heated region 28 may easily deform by heat conduction from the substrate-heated region 28.

In contrast, in the first study example (FIGS. 7 and 8) and the present embodiment (FIGS. 1 and 4), the upper structure 5a and the upper structure 5b constituting the stage are spaced apart at a predetermined spacing, and the focus point position of the laser beam 20a overlaps the gap (region) between the upper structure 5a and the upper structure 5b in plan view. From another viewpoint, the laser beam irradiated region in the substrate 3 (amorphous silicon film 3a) overlaps the gap (region) between the upper structure 5a and the upper structure 5b in plan view. As a result, heat is less likely to transmit from the substrate-heated region 28 to the upper structures 5a and 5b (particularly the surface-side member 6 of the upper structures 5a and 5b) while laser processing is performed on the substrate 3 (amorphous silicon film 3a). Namely, since there are no upper structures (5a, 5b) just below the laser beam irradiated region in the substrate 3 (amorphous silicon film 3a), heat is less likely to transmit from the substrate-heated region 28 to the upper structures (5a, 5b), and it is possible to reduce a risk in which the surface-side member 6 constituting the upper structures (5a, 5b) is deformed by heat conduction from the substrate-heated region 28. As a result, it is possible to reduce a risk of variations in the height position of the substrate 3 that is moved while being levitated on the stage 2. For this reason, in the second study example (FIGS. 7 and 8) and the present embodiment (FIGS. 1 and 4), the upper structure 5a and the upper structure 5b constituting the stage (2, 202) are spaced apart from each other, and the focus point position of the laser beam 20a overlaps the gap (region) between the upper structure 5a and the upper structure 5b in plan view.

As described above, in the second study example (FIGS. 7 and 8) and in the present embodiment (FIGS. 1 and 4), the inert gas is sprayed from the opening 27 in the sealing box 26 onto the substrate 3 (amorphous silicon film 3a) when laser processing is performed. This is to prevent an unnecessary reaction from occurring when the laser beam 20a is irradiated onto the amorphous silicon film 3a on the substrate 3 and the amorphous silicon film 3a is changed into a polycrystalline silicon film. Namely, the inert gas is sprayed to irradiate the laser beam 20a onto the amorphous silicon film 3a in an atmosphere of the inert gas jetted from the opening 27 in the sealing box 26 and change the amorphous silicon film 3a into a polycrystalline silicon film.

Figure 9:
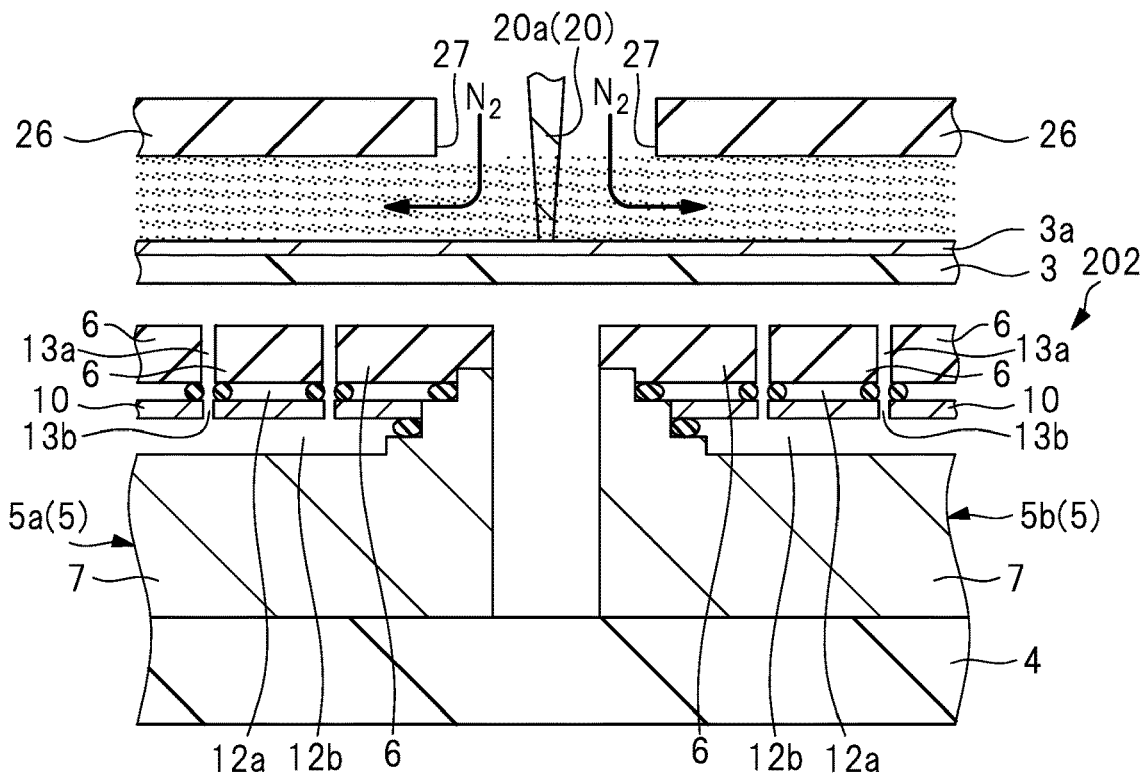
FIG. 9 is an explanatory view for describing problems in the laser processing apparatus of the second study example.
Figure 10:
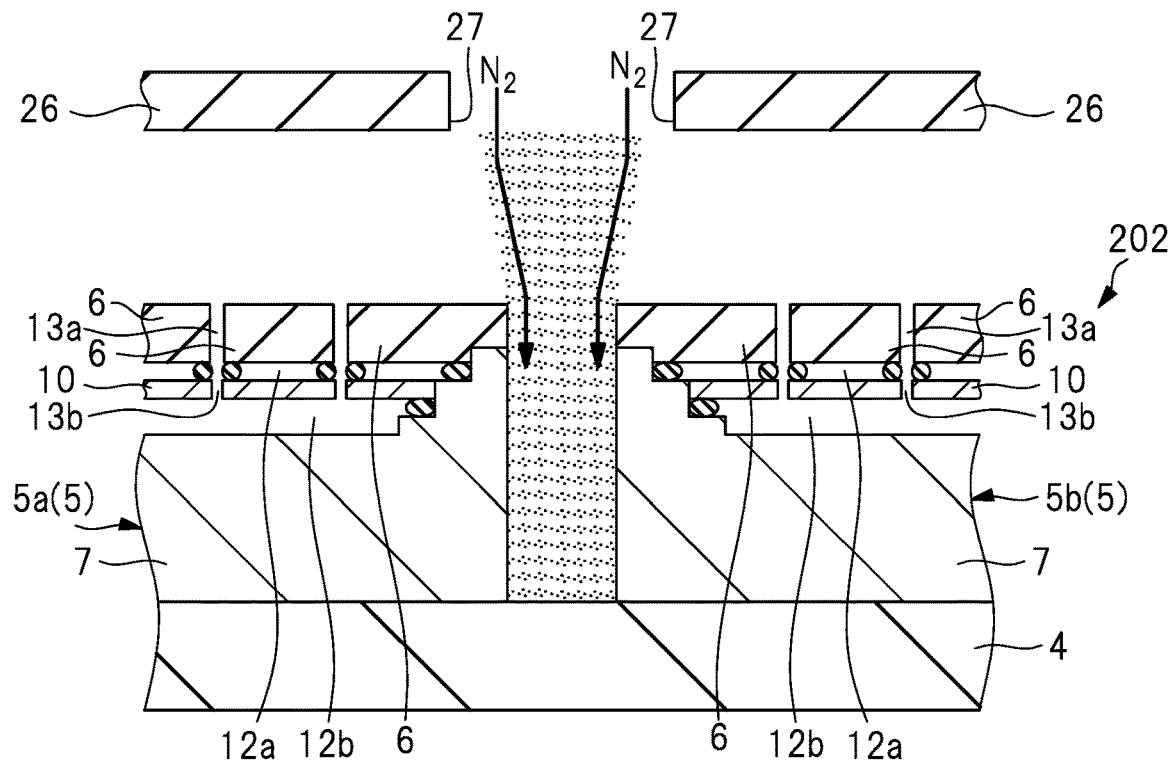
FIG. 10 is an explanatory view for describing problems in the laser processing apparatus of the second study example.
Figure 11:
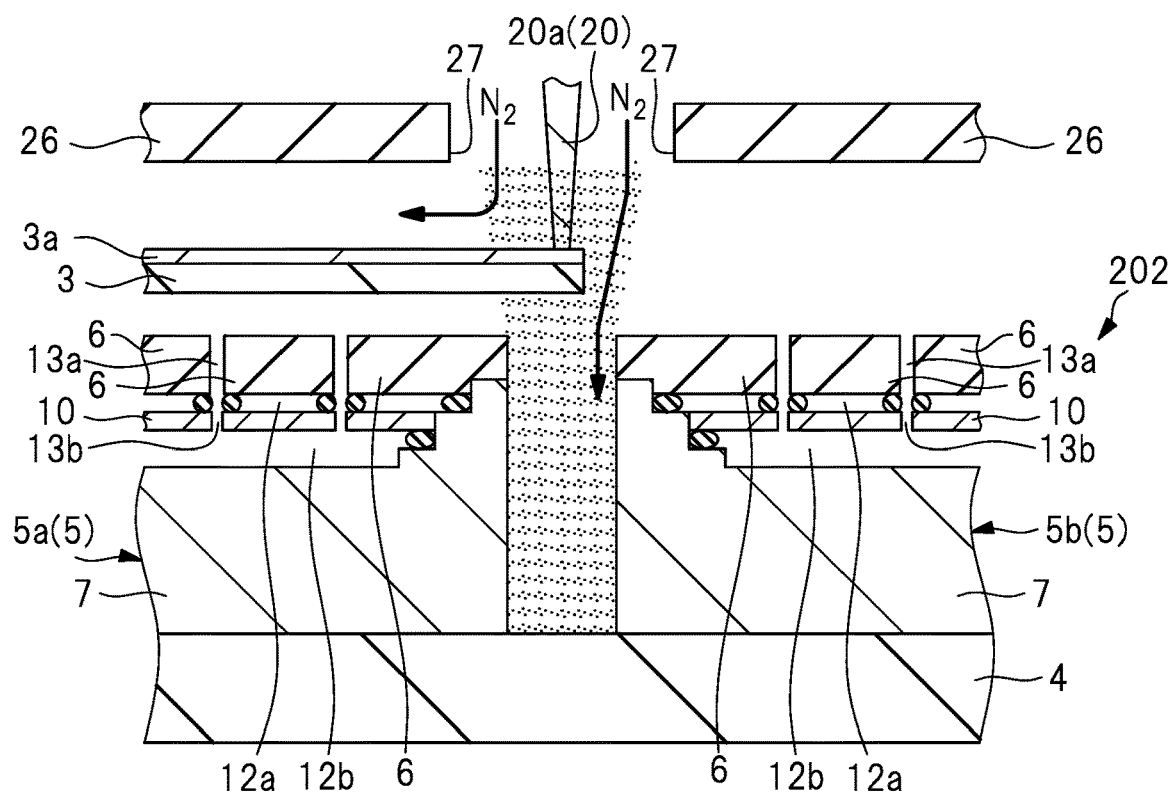
FIG. 11 is an explanatory view for describing problems in the laser processing apparatus of the second study example.

For this reason, in the second study example (FIGS. 7 and 8) and the present embodiment (FIGS. 1 and 4), the inert gas (such as nitrogen gas) is sprayed and the laser beam 20a is irradiated onto the amorphous silicon film 3a formed on the front surface of the substrate 3 while the substrate 3 is being levitated on the stage (2, 202) and moved in the horizontal direction. In addition, the present inventors have found that, in the case of the laser processing apparatus 201 of the second study example (FIGS. 7 and 8), the following problems described with reference to FIGS. 9 to 11 occur. FIGS. 9 to 11 are explanatory views for describing problems in the laser processing apparatus 201 of the second study example, and show cross-sectional views taken at positions corresponding to the above-described FIG. 8.

Note that, in FIGS. 9 to 11 and FIGS. 12 to 14 described below, the inert gas atmosphere generated by the inert gas (such as nitrogen gas) jetted from the opening 27 in the sealing box is schematically indicated by dotted hatched lines. In addition, the arrows indicating the gas jetted from the upper surface of the surface-side member 6 constituting the upper structures 5a and 5b (upward arrows in FIGS. 4 and 8) and the arrows indicating the gas drawn in from the upper surface of the surface-side member 6 (through holes 13a) constituting the upper structures 5a and 5b (downward arrows in FIGS. 4 and 8) are omitted in FIGS. 9 to 11 and FIGS. 12 to 14 described below.

As shown in FIG. 9, while laser processing (laser beam 20a irradiation processing) is being performed on a certain substrate 3, the inert gas jetted from the opening 27 in the sealing box 26 is sprayed onto the substrate 3 (amorphous silicon film 3a) and spreads horizontally in the space on the substrate 3. At this time, the inert gas jetted from the opening 27 in the sealing box 26 is shielded by the substrate 3 and is not supplied to the gap between the upper structure 5a and the upper structure 5b. On the other hand, as shown in FIG. 10, during a period from the end of laser processing on the certain substrate 3 to the start of laser processing on the next substrate 3, the substrate 3 is not present above the gap between the upper structure 5a and the upper structure 5b. At this time, since the substrate 3 is not present at the destination of the gas, the inert gas jetted from the opening 27 in the sealing box 26 travels toward the stage 2 without being shielded by the substrate 3 and is supplied to the gap between the upper structure 5a and the upper structure 5b. As shown in FIG. 10, in the case of the second study example, since a component corresponding to the above-described filling member 8 is not arranged between the upper structure 5a and the upper structure 5b, the inert gas supplied from the opening 27 in the sealing box 26 to the gap between the upper structure 5a and the upper structure 5b would flow downward between the upper structure 5a and the upper structure 5b. Since the inert gas flowing downward between the upper structure 5a and the upper structure 5b makes it difficult for the inert gas to spread horizontally (particularly in the X direction) on the upper surfaces of the upper structures 5a and 5b, a range of the inert gas atmosphere in plan view would be restricted to the gap between the upper structure 5a and the upper structure 5b and its vicinity, and the range of the inert gas atmosphere in plan view would become narrow (see FIG. 10).

The next substrate 3 is moved while being levitated on the stage 2, and when an end portion of this substrate 3 reaches a position above the gap between the upper structure 5a and the upper structure 5b as shown in FIG. 11, laser processing on this substrate 3 (laser beam 20a irradiation processing) is started. At this time, at a stage immediately after laser processing on the substrate 3 is started (that is, at a stage in which the laser beam 20a is irradiated onto a vicinity of the end portion of the substrate 3 as shown in FIG. 11), since the range of the inert gas atmosphere is narrow in plan view as described above, the inert gas atmosphere in the vicinity of the laser beam irradiated region (20b) is not stable and atmospheric components are more likely to be mixed in the inert gas atmosphere. For this reason, at the stage immediately after laser processing on the substrate 3 is started (that is, at the stage shown in FIG. 11), there is a risk that the laser beam 20a is irradiated onto the substrate 3 (amorphous silicon film 3a) in an atmosphere in which the inert gas and also atmospheric components are mixed therein.

When the substrate 3 continues to be further moved from the state shown in FIG. 11, the state becomes the state shown in the above-described FIG. 9, and since the inert gas jetted from the opening 27 in the sealing box 26 spreads horizontally (particularly in the X direction) on the substrate 3, the range of the inert gas atmosphere in plan view becomes wide, and atmospheric components are less likely to be mixed in the inert gas atmosphere in the vicinity of the laser beam irradiated region (20b). For this reason, in the state shown in FIG. 9, the laser beam 20a is irradiated onto the substrate 3 (amorphous silicon film 3a) in the inert gas atmosphere in which almost no atmospheric components are mixed therein.

For this reason, in the case of the second study example, there is a risk of variations in the laser processing conditions for the substrate 3 (amorphous silicon film 3a) between a position in the vicinity of the end portion of the substrate 3 and a position away from the end portion. Specifically, there is a risk that the atmosphere when the laser beam 20a is irradiated (atmosphere in the vicinity of the laser beam irradiated region 20b) differs between the position in the vicinity of the end portion of the substrate 3 and the position away from the end position, and that the degree of crystallization when the amorphous silicon film 3a is changed into a polycrystalline silicon film differs. For example, when the amorphous silicon film 3a on the substrate 3 is changed into a polycrystalline silicon film by laser processing, a crystal grain size of the polycrystalline silicon film in the vicinity of the end portion of the substrate 3 may differ from the crystal grain size of the polycrystalline silicon film at a position away from the end portion of the substrate 3 (such as in the vicinity of a center of the substrate 3), causing the crystal grain size of the polycrystalline silicon film on the substrate 3 to be uneven (non-uniform). Since this leads to a decrease in reliability of an element (such as a thin film transistor element) or an apparatus (such as a display apparatus) that uses such a polycrystalline silicon film, it is desirable to prevent such a problem from occurring.

In addition, irradiation of the laser beam 20a onto the amorphous silicon film 3a in an atmosphere in which atmospheric components are mixed therein would cause an unnecessary reaction to occur when the amorphous silicon film 3a is changed into a polycrystalline silicon film. Since this leads to a decrease in reliability of the element (such as the thin film transistor element) or the apparatus (such as the display apparatus) that uses such a polycrystalline silicon film, it is desirable to prevent such a problem from occurring.

<Main Features and Effects>

Figure 12:
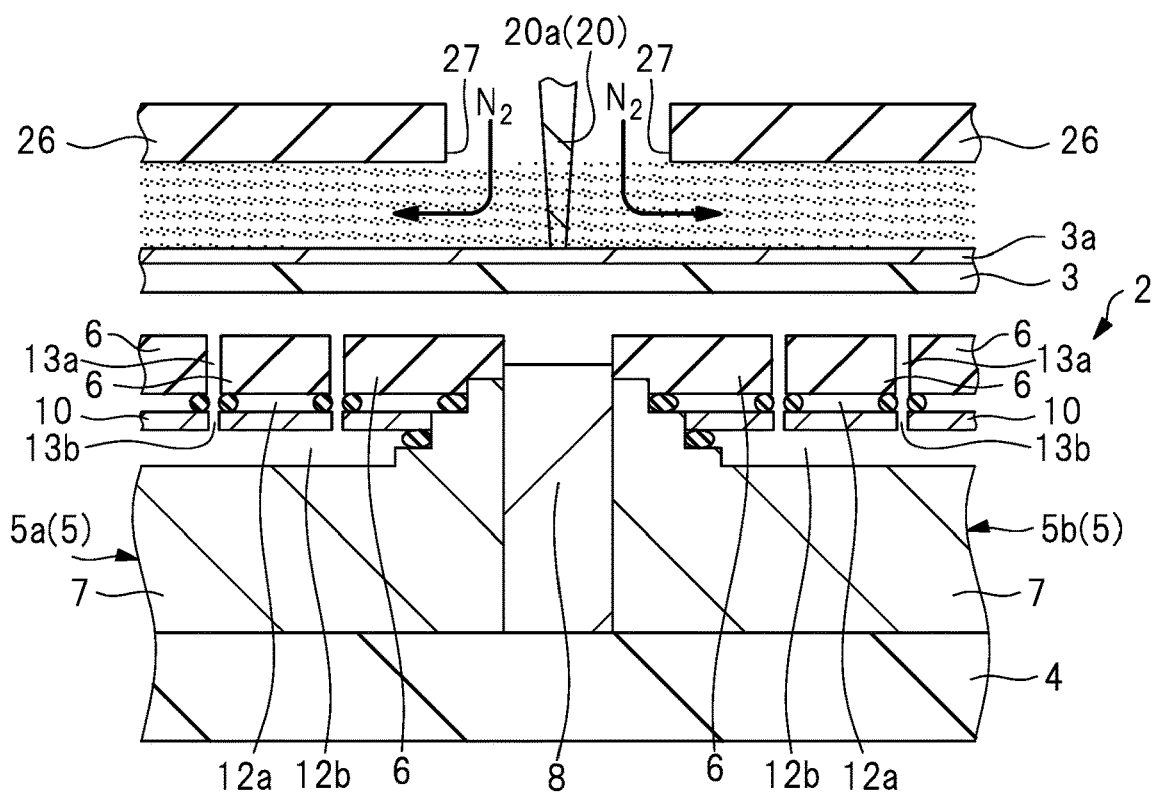
FIG. 12 is an explanatory view for describing effects of the laser processing apparatus according to one embodiment.
Figure 13:
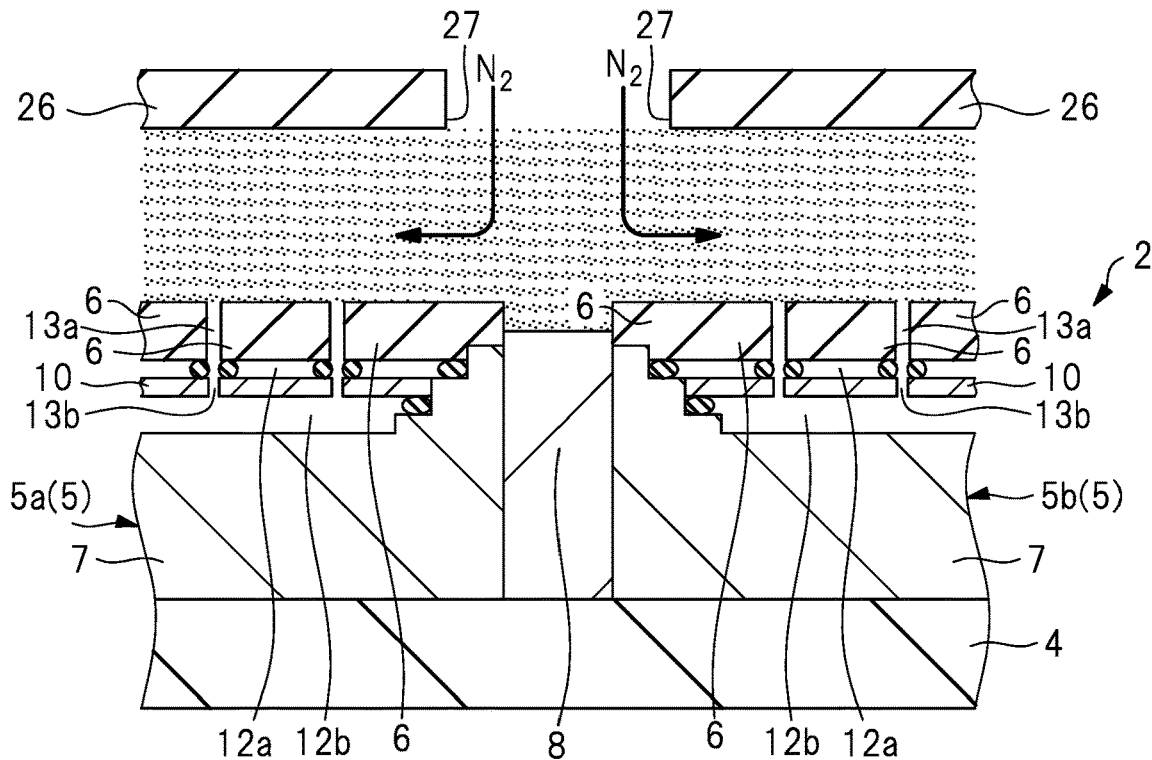
FIG. 13 is an explanatory view for describing effects of the laser processing apparatus according to one embodiment.
Figure 14:
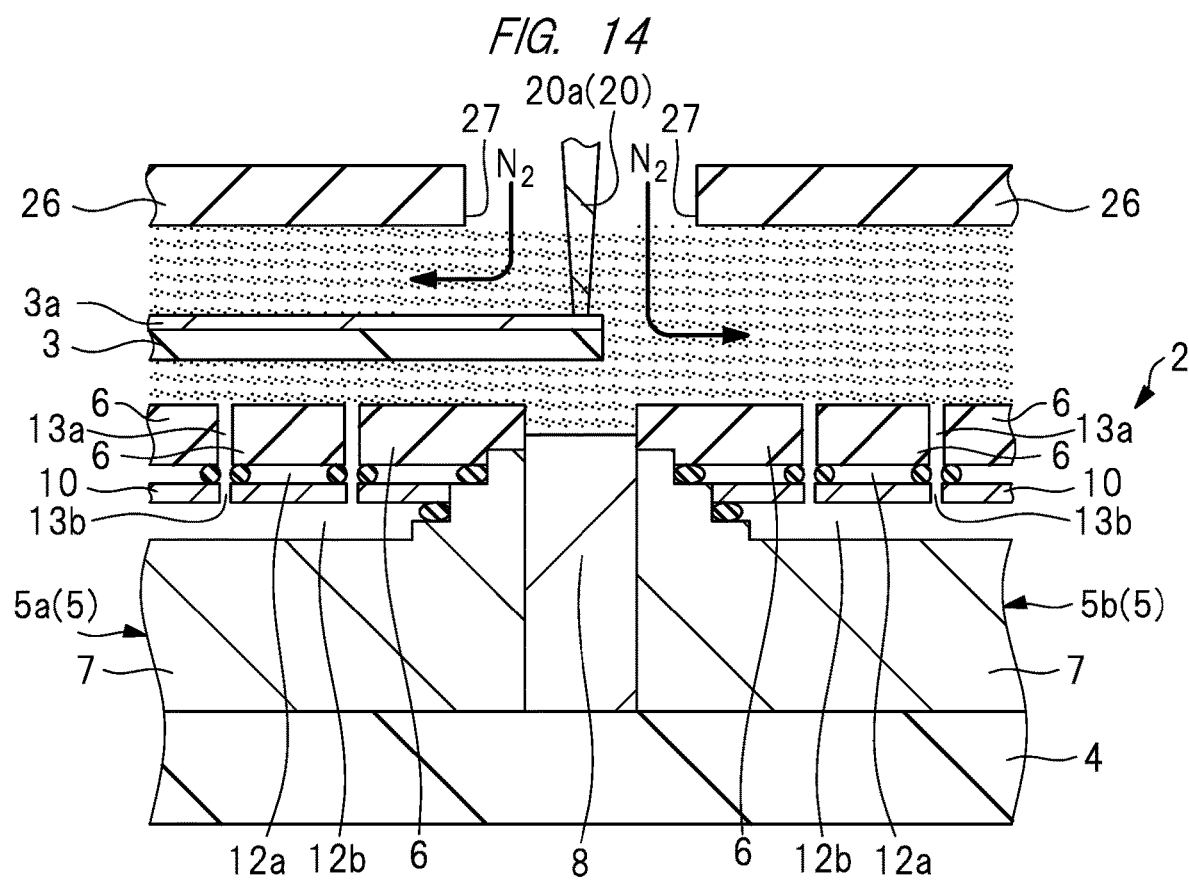
FIG. 14 is an explanatory view for describing effects of the laser processing apparatus according to one embodiment.

Next, main features and effects of the laser processing apparatus of the present embodiment will be described. FIGS. 12 to 14 are explanatory views for describing the effects of the laser processing apparatus 1 of the present embodiment, and show cross-sectional views taken at positions corresponding to the above-described FIG. 8.

In the present embodiment, the upper structure 5a and the upper structure 5b are spaced apart from each other at a predetermined spacing, the filling member 8 is arranged between the upper structure 5a and the upper structure 5b, and the focus point position of the laser beam 20a (laser beam irradiated region in the substrate 3) overlaps the gap (filling member 8) between the upper structure 5a and the upper structure 5b in plan view. As a result, since the filling member 8 and not the upper structures 5a and 5b is present in the region just below the laser beam irradiated region of the substrate 3 which is a region to which heat is easily transmitted from the substrate-heated region 28, it is possible to suppress or prevent deformation of the upper structures 5a and 5b (particularly the surface-side member 6) by thermal distortion. Therefore, it is possible to suppress or prevent variations in the height position of the substrate 3 that is moved while being levitated on the stage 2.

Since the upper structures 5a and 5b act to jet the gas (substrate-levitating gas) from their upper surfaces and levitate the substrate 3, the upper structures 5a and 5b (particularly the surface-side member 6) deformed by the thermal distortion would cause variations in the height position of the substrate 3 that is moved while being levitated on the stage 2. In contrast, the filling member 8 is not a member that jets the gas (substrate-levitating gas) from its upper surface, that is, it is not a member that acts to levitate the substrate 3. For this reason, even if the filling member 8 is deformed by thermal distortion caused by heat conduction from the substrate-heated region 28, the risk of affecting the height position of the substrate 3 is small compared to a case where the upper structures 5a and 5b (particularly the surface-side member 6) are deformed by thermal distortion. For this reason, since the upper structure 5a and the upper structure 5b are spaced apart from each other at a predetermined spacing, and the filling member 8 is arranged between the upper structure 5a and the upper structure 5b, the risk of deformation of the member that jets the gas for levitating the substrate 3 by heat conduction from the substrate-heated region 28 can be reduced. Therefore, it is possible to suppress or prevent variations in the height position of the substrate 3 that is moved while being levitated on the stage 2.

In addition, in the case of the second study example, since there is no component corresponding to the above-described filling member 8 arranged between the upper structures 5a and 5b, the inert gas jetted from the opening 27 in the sealing box 26 would flow downward between the upper structure 5a and the upper structure 5b when the substrate 3 is not present above the gap between the upper structure 5a and the upper structure 5b (at the stage shown in FIG. 10), as described above with reference to FIGS. 9 to 11. In this case, since it is difficult for the inert gas to spread horizontally (particularly in the X direction) on the upper surfaces of the upper structures 5a and 5b, and the range of the inert gas atmosphere in plan view becomes narrow, there is a risk that the inert gas atmosphere in the vicinity of laser beam irradiated region (20b) is not stable and the laser beam 20a may be irradiated onto the substrate 3 (amorphous silicon film 3a) in an atmosphere including atmospheric components.

In the present embodiment, as shown in FIG. 12, while laser processing (laser beam 20a irradiation processing) is being performed on a certain substrate 3, the inert gas jetted from the opening 27 in the sealing box 26 is sprayed onto the substrate (amorphous silicon film 3a) and spreads horizontally in the space on the substrate 3. Then, as shown in FIG. 13, during the period from the end of laser processing on the certain substrate 3 to the start of laser processing on the next substrate 3, the substrate 3 is not present above the gap between the upper structure 5a and the upper structure 5b, and the filling member is arranged between the upper structure 5a and the upper structure 5b. At this time, as can be seen from FIG. 13, since the substrate 3 is not present at the destination of the gas, the inert gas jetted from the opening 27 in the sealing box 26 can travel toward the stage 2 without being shielded by the substrate 3, and thus can travel toward the gap between the upper structure 5a and the upper structure 5b. However, the flow of the gas is restricted by the filling member 8. Namely, in the present embodiment, the inert gas jetted from the opening 27 in the sealing box 26 does not flow below the filling member 8 between the upper structure 5a and the upper structure 5b (more specifically, below the upper surface of the filling member 8). For this reason, since the inert gas jetted from the opening 27 in the sealing box 26 not flowing downward between the upper structure 5a and the upper structure 5b makes it easier for the inert gas to spread horizontally (particularly in the X direction) on the upper surfaces of the upper structures 5a and 5b, the range of the inert gas atmosphere in plan view can reach a position at a certain distance (in the X direction) away from the gap between the upper structures 5a and 5b (see FIG. 13). Therefore, the range of the inert gas atmosphere in plan view becomes wide.

The next substrate 3 is moved while being levitated on the stage 2, and when the end portion of this substrate 3 reaches a position above the gap between the upper structure 5a and the upper structure 5b as shown in FIG. 14, laser processing on this substrate 3 (laser beam 20a irradiation processing) is started. At this time, even at the stage immediately after laser processing on the substrate 3 is started (that is, at the stage in which the laser beam 20a is irradiated onto the vicinity of the end portion of the substrate 3 as shown in FIG. 14), since the range of the inert gas atmosphere in plan view is wide as described above, the inert gas atmosphere in the vicinity of the laser beam irradiated region (20b) is stable, and atmospheric components are less likely to be mixed in the inert gas atmosphere. For this reason, at the stage immediately after laser processing on the substrate 3 is started (that is, at the stage shown in FIG. 4), the laser beam 20a is irradiated onto the substrate 3 (amorphous silicon film 3a) in the inert gas atmosphere in which almost no atmospheric components are mixed therein.

When the substrate 3 continues to be further moved from the state shown in FIG. 14, the state becomes the state shown in the above-described FIG. 12, and the inert gas jetted from the opening 27 in the sealing box 26 spreads horizontally on the substrate 3. Even at this stage (stage shown in FIG. 12), since the range of the inert gas atmosphere in plan view is wide, the inert gas atmosphere in the vicinity of the laser beam irradiated region (20b) is stable, atmospheric components are less likely to be mixed in the inert gas atmosphere, and the laser beam 20a is irradiated onto the substrate 3 (amorphous silicon film 3a) in the inert gas atmosphere in which almost no atmospheric components are mixed therein.

For this reason, in the present embodiment, it is possible to suppress or prevent variations in the laser processing conditions for the substrate 3 (amorphous silicon film 3a) in the vicinity of the end portion of the substrate 3 and at the position away from the end portion. Specifically, in a case where laser processing is performed on the plurality of substrates 3, during the period from the start of laser processing on each of the substrates 3 to the end of laser processing on the substrate 3, the laser beam 20a can be irradiated onto the substrate 3 (amorphous silicon film 3a) in the inert gas atmosphere in which almost no atmospheric components are mixed therein. For this reason, for each of the substrates 3, the atmosphere when the laser beam 20a is irradiated (atmosphere in the vicinity of the laser beam irradiated region 20b) can be made the same in the vicinity of the end portion of the substrate 3 and at the position away from the end portion, and the degree of crystallization when the amorphous silicon film 3a is changed into a polycrystalline silicon film can be made the same (uniform). For example, when the amorphous silicon film 3a on the substrate 3 is changed into a polycrystalline silicon film by laser processing, the crystal grain size of the polycrystalline silicon film in the vicinity of the end portion of the substrate 3 and the crystal grain size of the polycrystalline silicon film at the position away from the end portion of the substrate 3 (such as in the vicinity of the center of the substrate 3) can be made the same, and thus, the crystal grain size of the polycrystalline silicon film on the substrate 3 can be made uniform. For this reason, reliability of the element (such as the thin film transistor) or the apparatus (such as the display apparatus) that uses such a polycrystalline silicon film can be enhanced.

In addition, in the present embodiment, since it is possible to prevent the laser beam 20a from irradiating the amorphous silicon film 3a in an atmosphere in which atmospheric components are mixed therein, it is possible to prevent an unnecessary reaction from occurring when the amorphous silicon film 3a is changed into a polycrystalline silicon film. As a result, reliability of the element (such as thin film transistor) or the apparatus (such as display apparatus) that uses such a polycrystalline silicon film can be enhanced.

In addition, it is preferable that the upper surface of the filling member 8 arranged between the upper structure 5a and the upper structure 5b is lower than each of the upper surfaces of the upper structures 5a and 5b (that is, the upper surface of the surface-side member 6 constituting each of the upper structures 5a and 5b). The reason for this is as follows.

If the upper surface of the filling member 8 is at a position higher than each of the upper surfaces of the upper structures 5a and 5b, the filling member 8 partially protrudes from each of the upper surfaces of the upper structures 5a and 5b. Therefore, there is a risk that the filling member 8 blocks the movement of the substrate 3 that is moved in the horizontal direction while being levitated on the stage 2. For this reason, the height position of the upper surface of the filling member 8 is made the same or lower than each of the upper surfaces of the upper structures 5a and 5b to prevent the filling member 8 from blocking the movement of the substrate 3 that is moved in the horizontal direction while being levitated on the stage 2.

When the height position of the upper surface of the filling member 8 is lower than each of the upper surfaces of the upper structures 5a and 5b, the distance from the substrate-heated region 28 to the upper surface of the filling member 8 can be increased without changing the spacing between the upper surfaces of the upper structures 5a and 5b (surface-side member 6) and the lower surface of the substrate 3. As a result, since lowering the height position of the upper surface of the filling member 8 located below the substrate-heated region 28 makes it less likely for heat to transmit from the substrate-heated region 28 to the stage 2, it is possible to reduce a risk of deformation of the stage 2 by heat conduction from the substrate-heated region 28.

Namely, since the heat transmitted from the substrate-heated region 28 to the filling member 8 is also conducted from the filling member 8 to the upper structures 5a and 5b, making it difficult for heat to transmit from the substrate-heated region 28 to the filling member 8 suppresses an increase in temperature of the upper structures 5a and 5b, and a risk of deformation of the upper structures 5a and 5b (particularly the surface-side member 6) can be reduced. For this reason, making the height position of the upper surface of the filling member 8 lower than each of the upper surfaces of the upper structures 5a and 5b makes it difficult for the heat to transmit from the substrate-heated region 28 to the filling member 8. Since it is possible to suppress an increase in temperature of the upper structures 5a and 5b, it is possible to reduce a risk of deformation of the upper structures 5a and 5b (particularly the surface-side member 6). In addition, since the filling member 8 is not a member for levitating the substrate 3, even if the height position of the upper surface of the filling member 8 is made to be lower than each of the upper surfaces of the upper structures 5a and 5b, there is no adverse effect on movement of the substrate 3 while levitating the substrate 3.

In addition, it is preferable that a height difference h1 between the upper surface of the filling member 8 and each of the upper surfaces of the upper structures 5a and 5b is less than or equal to 40 mm (h1≤40 mm). As a result, it is easier to obtain an effect of restricting the flow of the inert gas by the filling member 8. For this reason, it is easier for the inert gas jetted from the opening 27 to spread horizontally (particularly in the X direction) on the upper surfaces of the upper structures 5a and 5b when the substrate 3 is not present above the gap between the upper structure 5a and the upper structure 5b, and the range of the inert gas atmosphere in plan view can be made wider more precisely.

In addition, it is preferable that the upper surface of the upper structure 5a and the upper surface of the upper structure 5b are at the same height position as each other. As a result, it is easier to control the height position of the substrate 3 at the position where the laser beam 20a is irradiated to a predetermined height, and to control the laser processing conditions for the substrate 3 (amorphous silicon film 3a) to predetermined conditions.

In addition, the filling member 8 acts to prevent the inert gas jetted from the opening 27 in the sealing box 26 from flowing to a side lower than the filling member 8 between the upper structure 5a and the upper structure 5b. For this reason, it is preferable that the filling member 8 is in contact with the upper structures 5a and 5b, and thus, it is preferable that a side surface of the filling member 8 (side surface on a side facing the upper structure 5a) is in contact with a side surface of the upper structure 5a (side surface on the side facing the filling member 8), and that the other side surface of the filling member (side surface on a side facing the upper structure 5b) is in contact with a side surface of the upper structure 5b (side surface on a side facing the filling member 8). As a result, it is possible to more precisely prevent the inert gas jetted from the opening 27 in the sealing box 26 from flowing to the side lower than the filling member 8 between the upper structure 5a and the upper structure 5b. In a case where the filling member 8 is in contact with the upper structures 5a and 5b, a dimension of the filling member 8 in the X direction is substantially the same as the spacing between the upper structure 5a and the upper structure 5b (spacing in the X direction).

In addition, it is preferable that the filling member 8 is arranged over the entire region between the upper structure 5a and the upper structure 5b in plan view. Namely, in plan view, it is preferable that the filling member 8 is present (extending) over the entire position between the upper structure 5a and the upper structure 5b along the Y direction, instead of being only partially present between the upper structure 5a and the upper structure 5b in the Y direction. As a result, it is possible to obtain the effect of restricting the flow of the inert gas by the filling member 8 over the entire region between the upper structure 5a and the upper structure 5b. For this reason, it is easier for the inert gas jetted from the opening 27 to spread horizontally (particularly in the X direction) on the upper surfaces of the upper structures 5a and 5b when the substrate 3 is not present above the gap between the upper structure 5a and the upper structure 5b, and the range of the inert gas atmosphere in plan view can be made wider more precisely.

In addition, the filling member 8 extends in the Y direction between the upper structure 5a and the upper structure 5b. Namely, the filling member 8 is arranged along the Y direction. The Y direction is the long axis direction of the laser beam 20a that is irradiated onto the substrate 3 (amorphous silicon film 3a). Namely, the filling member 8 is arranged between the upper structure 5a and the upper structure 5b along the long axis direction of the laser beam 20a (laser beam irradiated region 20b). As a result, it is easier to fill the gap between the upper structure 5a and the upper structure 5b spaced apart from each other in the X direction over the entire Y direction with the filling member 8, and it is possible to precisely obtain the effect of restricting the flow of the inert gas over the entire Y direction with the filling member 8.

In addition, the opening 27 in the sealing box 26 acts as a jetting port (spraying port) of the inert gas. The inert gas jetted from the opening 27 in the sealing box 26 should be supplied to the laser beam irradiated region 20b and its vicinity. This is because the inert gas jetted from the opening 27 in the sealing box 26 is used to make the atmosphere in the laser beam irradiated region 20b and its vicinity into an inert gas atmosphere such that the laser beam 20a is irradiated onto the substrate 3 (amorphous silicon film 3a) in the inert gas atmosphere. For this reason, the opening 27 in the sealing box 26 overlaps the laser beam irradiated region 20b in plan view, and thus overlaps the focus point position of the laser beam 20a. It is more preferable that the laser beam irradiated region 20b is enclosed by the opening 27 in the sealing box 26 in plan view. As a result, it is easier to supply the inert gas from the opening 27 in the sealing box 26 to the laser beam irradiated region 20b and its vicinity. Note that, in a case where the opening 27 in the sealing box 26 overlaps the laser beam irradiated region 20b in plan view, the opening 27 in the sealing box 26 overlaps the gap (filling member 8) between the upper structure 5a and the upper structure 5b in plan view.

In addition, the plurality of upper structures 5 of the stage 2 include the upper structures 5a and 5b and the other upper structures 5c. In the case of FIG. 2, the upper structures 5c are arranged so as to sandwich the upper structures 5a and 5b adjacent to each other in the X direction, with the upper structure 5c and the upper structure 5a adjacent to each other in the X direction, the upper structure 5a and the upper structure 5b adjacent to each other in the X direction, and the upper structure 5b and the upper structure 5c adjacent to each other in the X direction.

As described above, the filling member 8 is arranged between the upper structures 5a and 5b adjacent to each other in the X direction. However, a component corresponding to the above-described filling member 8 may or may not be provided between the adjacent upper structures 5c and 5a and between the adjacent upper structures 5b and 5c. This is because the region between the upper structures 5a and 5b overlaps the laser beam irradiated region 20b in plan view, and the region between the upper structures 5c and 5a and the region between the upper structures 5b and 5c are located away from the laser beam irradiated region 20b at a certain distance without overlapping the laser beam irradiated region 20b in plan view.

Namely, since the inert gas jetted from the opening 27 in the sealing box 26 should be supplied to the laser beam irradiated region 20b and its vicinity, the inert gas is jetted from the opening 27 in the sealing box 26 toward the laser beam irradiated region 20b, or from another viewpoint, from the opening 27 in the sealing box 26 toward the gap between the upper structures 5a and 5b. For this reason, if there is no filling member 8 between the upper structures 5a and 5b, the problems described above with reference to FIGS. 9 to 11 occur. However, even if there is no component corresponding to the above-described filling member 8 between the adjacent upper structures 5c and 5a and between the adjacent upper structures 5b and 5c, the problems described above with reference to FIGS. 9 to 11 do not occur. For this reason, even if a component corresponding to the filling member 8 is not provided between the upper structures 5a and 5c and between the upper structures 5b and 5c, if the filling member 8 is provided between the upper structures 5a and 5b, the problems described above with reference to FIGS. 9 to 11 can be improved or solved. In addition, since the structure of the stage 2 can be made simpler in a case where a component corresponding to the filling member 8 is not provided between the upper structures 5a and 5c and between the upper structures 5b and 5c, it is easier to assemble the stage 2. Similar to between the adjacent upper structures 5a and 5c and between the adjacent upper structures 5b and 5c, it is possible to not provide a component corresponding to the filling member 8 between the adjacent upper structures 5c.

In addition, each of the upper structures 5a, 5b and 5c jets gas from the upper surface (front surface), and acts to levitate the substrate 3. However, a mechanism of the upper structure 5c that jet the gas can differ from those of the upper structures 5a and 5b. For example, as described above regarding the upper structures 5a and 5b, the gas is jetted from the minute holes (pores constituting the porous body) in the surface-side member 6 constituting the upper structures 5a and 5b to levitate the substrate 3 while the gas on the surface-side member 6 is sucked from the through holes 13a in the surface-side member 6 to suck the substrate 3. Namely, in the upper structures 5a and 5b, both jetting and sucking of the gas from the upper surface are performed to adjust the balance thereof. In contrast, regarding the upper structure 5c, the gas is jetted from the plurality of through hole provided in the surface-side member (corresponding to the surface-side member 6) constituting the upper structure 5c. However, a mechanism that sucks the gas on the surface-side member is not provided on the upper structure 5c. For this reason, the surface-side member constituting the upper structure 5c does not need to be a porous body, and for example, a metal plate having a plurality of (several) through holes can be used.

It is easier to control the height position of the substrate 3 levitated on the stage 2 with the upper structures 5a and 5b that can perform both jetting and sucking of the gas from the upper surface, and not the upper structure 5c that performs jetting of the gas but not sucking of the gas from the upper surface. On the other hand, it is desirable to accurately control the height position of the substrate 3 that is levitated on the stage 2 in the region close to the laser beam irradiated region 20b. For this reason, regarding the upper structures 5a and 5b close to the laser beam irradiated region 20b, both jetting and sucking of the gas from the upper surface can be performed to more precisely control the height position of the substrate 3 at the position where the laser beam 20a is irradiated and to easily control the laser processing conditions. On the other hand, regarding the upper structure 5c that is far from the position where the laser beam 20a is irradiated, jetting of the gas from the upper surface is performed but sucking of the gas is not performed to simplify the structure of the upper structure 5c. As a result, since it is easier to prepare the upper structure 5c, the manufacturing cost of the laser processing apparatus can be reduced.

<Example of Display Apparatus>

The laser processing apparatus 1 of the present embodiment can be preferably used in, for example, a manufacturing process of a display apparatus.

Figure 15:
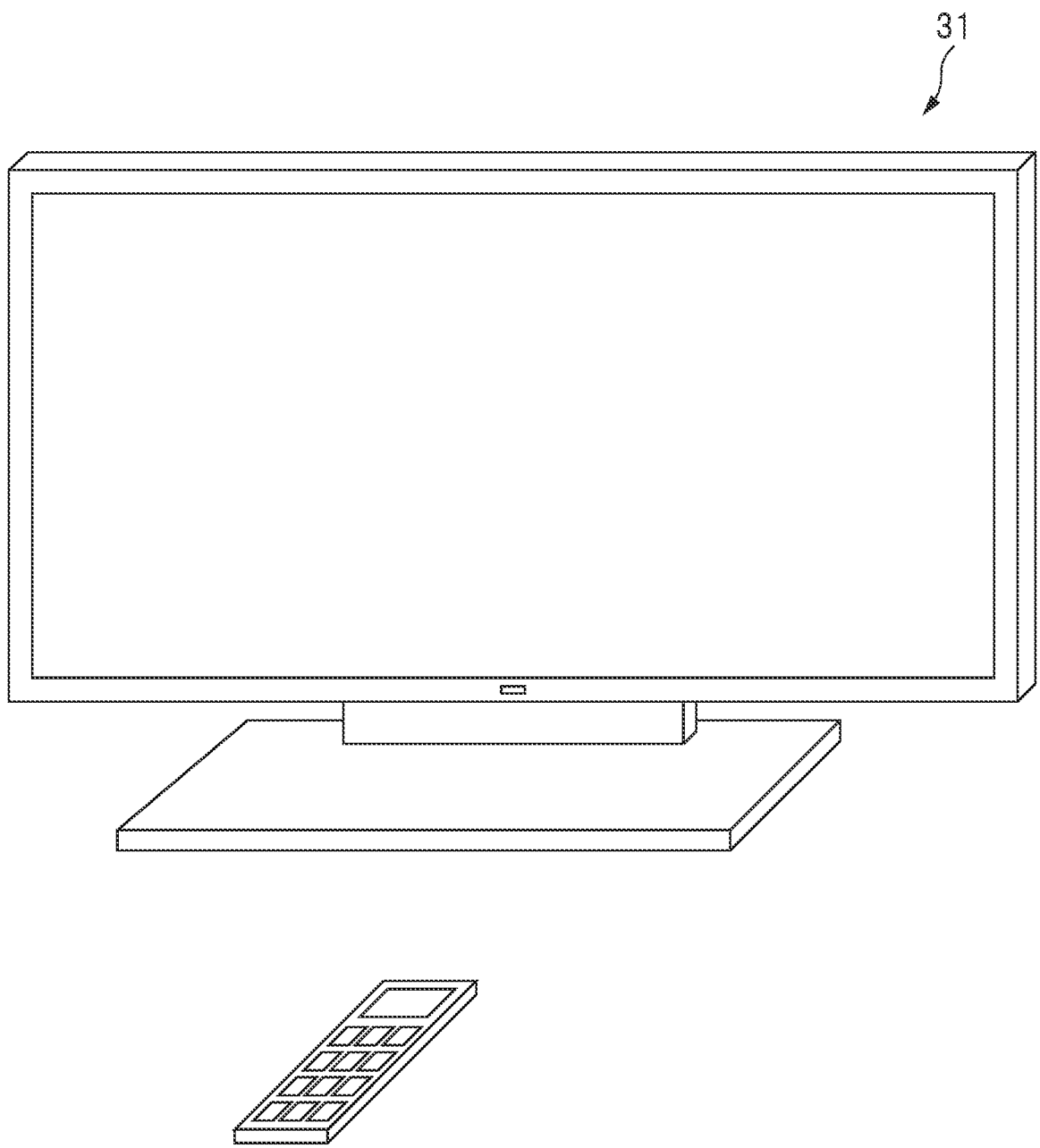
FIG. 15 is an external view showing a large-screen television as a liquid crystal display apparatus.
Figure 16:
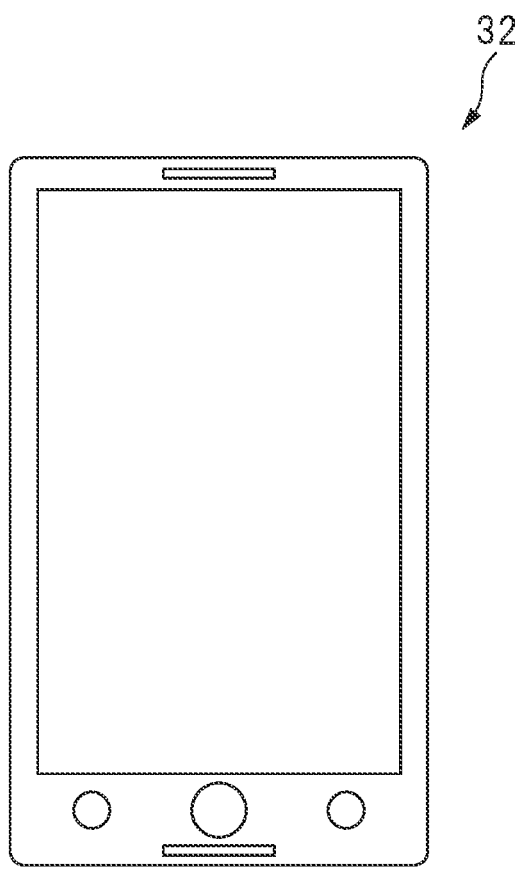
FIG. 16 is an external view showing a mobile communication device as the liquid crystal display apparatus.

FIG. 15 is an external view showing a large-screen television as a liquid crystal display apparatus, and FIG. 16 is an external view showing a mobile communication device as a liquid crystal display apparatus. A large-screen television 31 shown in FIG. 15 and a smartphone 32 as a mobile communication device shown in FIG. 16 are examples of the display apparatus in the present embodiment.

Thus, display apparatuses of various sizes are covered as display apparatuses according to the present embodiment. In addition, the display apparatus according to the present embodiment is not limited to the liquid crystal display apparatus, and also includes, for example, an organic EL display apparatus.

<Manufacturing Process of Display Apparatus>

Figure 17:
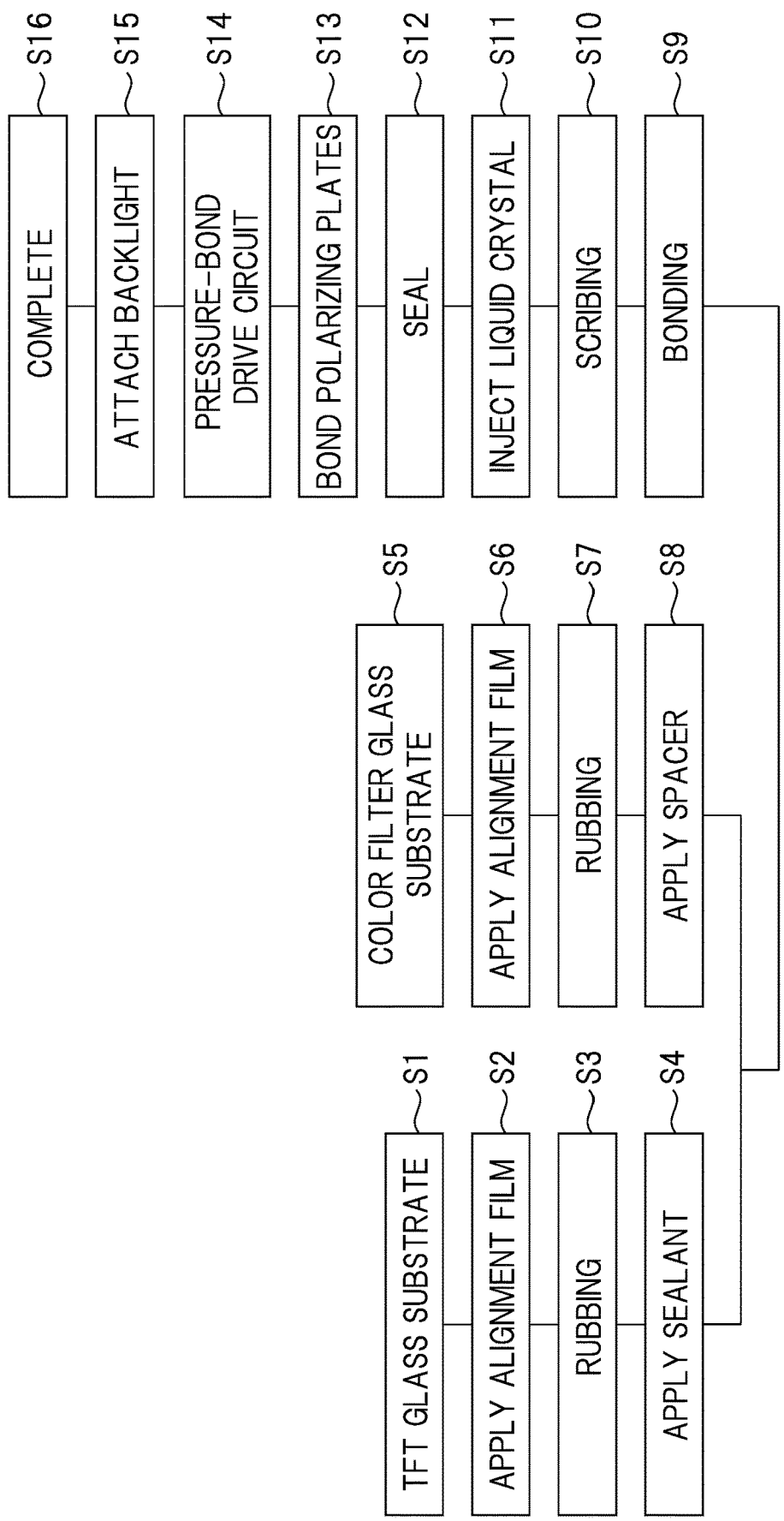
FIG. 17 is a flowchart showing a flow of a manufacturing process for manufacturing a display apparatus according to one embodiment.

Next, an overview of the manufacturing process of the display apparatus according to the present embodiment will be briefly described using the manufacturing process of the liquid crystal display apparatus as an example and with reference to FIG. 17. FIG. 17 is a flowchart showing a flow of the manufacturing process for manufacturing the display apparatus according to the present embodiment.

First, a TFT glass substrate and a color filter glass substrate are each formed.

Specifically, a glass substrate is prepared, and a thin film transistor (Thin Film Transistor: TFT) is formed on the glass substrate to obtain the TFT glass substrate (glass substrate on which the TFT is formed) (step S1 in FIG. 17). This thin film transistor formation process includes laser processing using the above-described laser processing apparatus 1, and this glass substrate corresponds to the above-described substrate 3 and a substrate 50 described below.

Next, an alignment film is applied to a front surface of the TFT glass substrate (step S2 in FIG. 17), and then a rubbing process is performed (step S3 in FIG. 17). Then, a sealant is applied to the front surface of the TFT glass substrate (step S4 in FIG. 17).

On the other hand, another glass substrate is prepared, and a color filter is formed on this glass substrate to obtain the color filter glass substrate (glass substrate on which the color filter is formed) (step S5 in FIG. 17).

Next, an alignment film is applied to a front surface of the color filter glass substrate (step S6 in FIG. 17), and then the rubbing process is performed (step S7 in FIG. 17). Then, a spacer is applied to the front surface of the color filter glass substrate (step S8 in FIG. 17).

Next, the TFT glass substrate and the color filter glass substrate are bonded together (step S9 in FIG. 17), and a scribing (splitting) process is performed (step S10 in FIG. 17). As a result, the bonded TFT glass substrate and color filter glass substrate are cut to a size of an individual liquid crystal display apparatus.

Then, liquid crystal is injected into the gap between the TFT glass substrate and the color filter glass substrate, the gap being secured by the sealant and the spacer (step S11 in FIG. 17), and then the gap is sealed (step S12 in FIG. 17).

Next, a pair of polarizing plates is adhered so as to sandwich the bonded TFT glass substrate and color filter glass substrate (step S13 in FIG. 17). In this manner, a liquid crystal display panel can be manufactured. Then, a drive circuit is pressure-bonded to the liquid crystal display panel (step S14 in FIG. 17), and then a backlight is further attached thereto (step S15 in FIG. 17). In this manner, the liquid crystal display apparatus is completed (step S16 in FIG. 17).

<Detailed Configuration of Display Apparatus>

Figure 18:
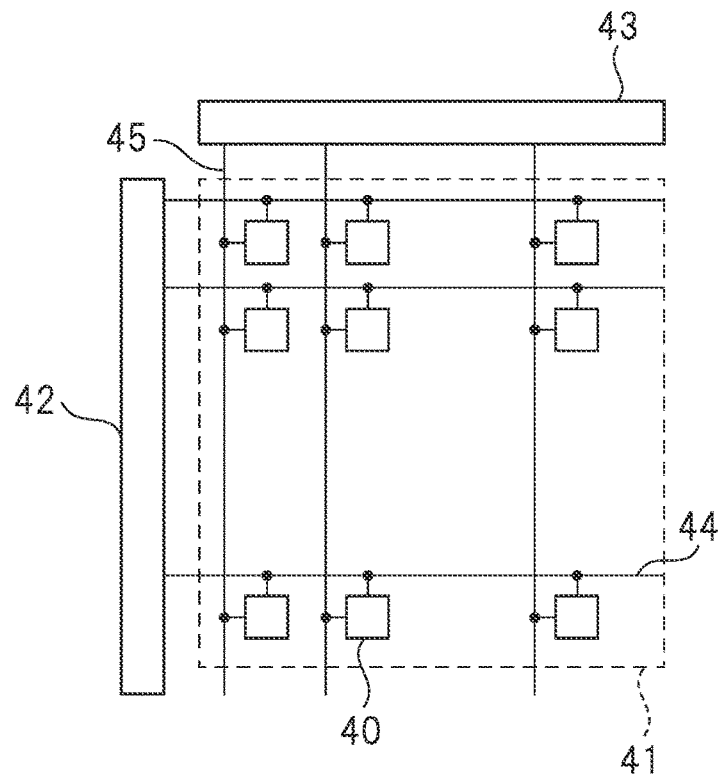
FIG. 18 is a drawing showing a configuration example of the display apparatus according to one embodiment.

Next, a detailed configuration of the display apparatus according to the present embodiment will be described. FIG. 18 is a drawing showing a configuration example of the display apparatus according to the present embodiment.

In the configuration example shown in FIG. 18, the display apparatus has a pixel portion (pixel region) 41 in which a plurality of pixels 40 are arranged in a matrix-like manner, a scanning line drive circuit 42, and a signal line drive circuit 43. The pixels 40 are selected or deselected for each line by a scanning signal supplied by a wiring 44 (scanning line) electrically connected to the scanning line drive circuit 42. In addition, the pixel 40 selected by the scanning signal is supplied with an image signal (video signal) by the wiring 45 (signal line) electrically connected to the signal line drive circuit 43.

Figure 19:
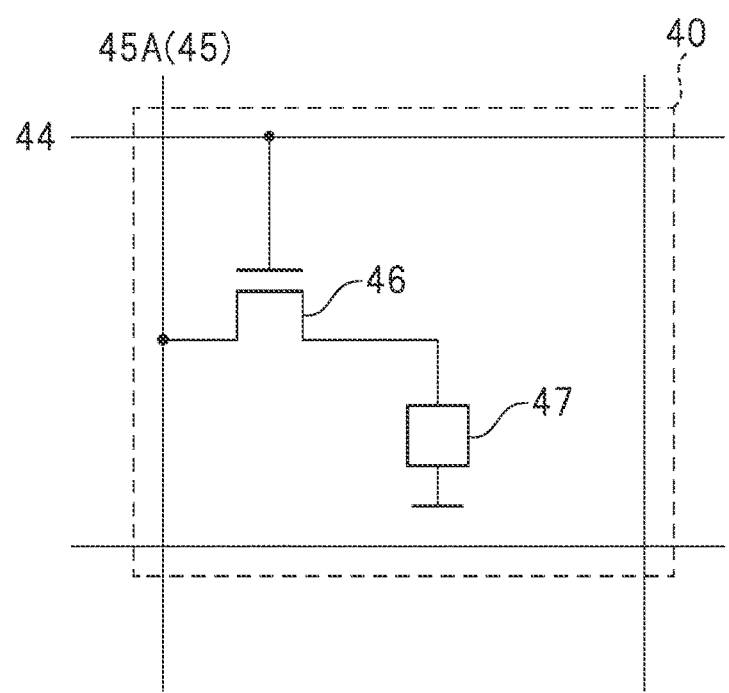
FIG. 19 is a drawing showing a configuration example of a pixel shown in FIG. 13.

FIG. 19 is a drawing showing a configuration example of the pixel shown in FIG. 18. As shown in FIG. 19, the pixel 40 is provided with a thin film transistor 46 that acts as a switching element for controlling the pixel, and a liquid crystal element 47 that acts as a display portion. For example, the liquid crystal element 47 has a structure in which a liquid crystal material is sandwiched between a pair of electrodes (a pixel electrode and an opposing electrode).

In the thin film transistor 46, a gate electrode is electrically connected to the wiring 44 (scanning line), one of the source electrode and drain electrode is electrically connected to a wiring 45A (signal line), and the other of the source electrode and drain electrode is electrically connected to the pixel electrode of the liquid crystal element 47.

<Device Structure of Thin Film Transistor>

Figure 20:
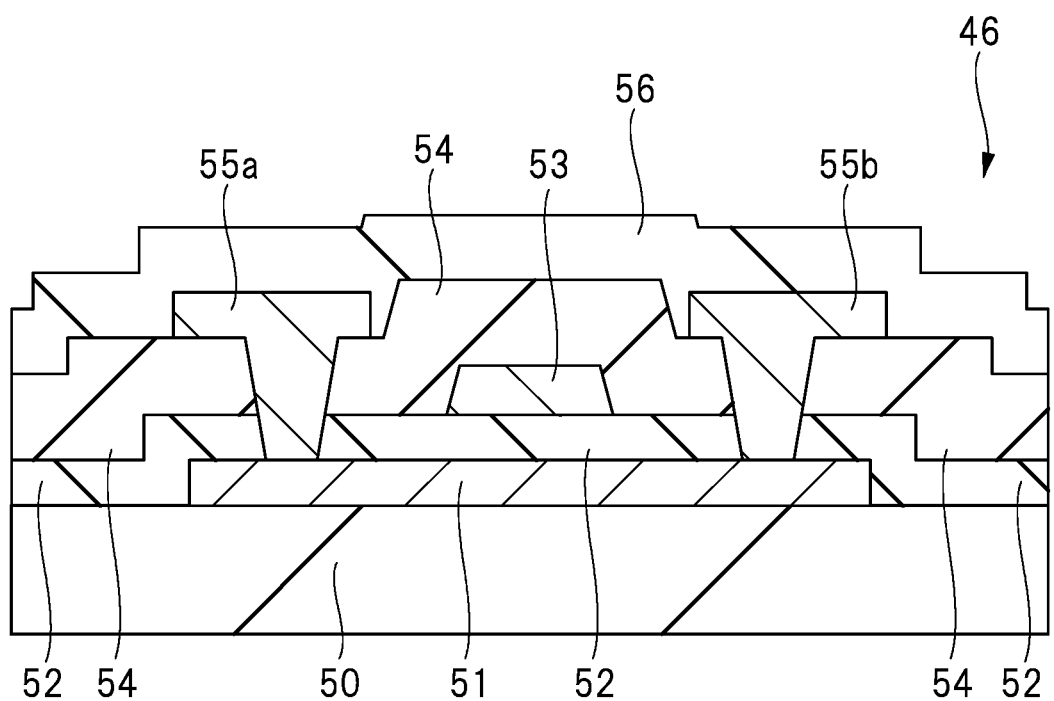
FIG. 20 is a cross-sectional view showing a device structure of a thin film transistor.

Next, a device structure of the thin film transistor 46 will be described. FIG. 20 is a cross-sectional view showing the device structure of the thin film transistor.

The thin film transistor 46 shown in FIG. 20 has a top-gate type structure. The thin film transistor 46 has a channel film 51 formed on the substrate 50 (such as a glass substrate) having an insulating surface. The channel film 51 is made of a polycrystalline silicon film which is a polycrystalline semiconductor film. Then, a gate insulating film 52 is formed on the substrate 50 so as to cover the channel film 51, and a gate electrode 53 is formed on the gate insulating film 52. An interlayer insulating film 54 is formed on the gate insulating film 52 so as to cover the gate electrode 53, and a source electrode 55a and a drain electrode 55b are formed on the interlayer insulating film 54. Each of the source electrode 55a and drain electrode 55b is in contact with the channel film 51 via a through hole provided in the interlayer insulating film 54 and the gate insulating film 52. A protective film 56 is formed so as to cover the interlayer insulating film 54, the source electrode 55a and the drain electrode 55b. In the above-described manner, the thin film transistor 46 is formed.

Here, a case where the thin film transistor 46 has a top-gate type structure has been described. However, as another form, the thin film transistor 46 may have a bottom-gate type structure.

<Manufacturing Process of Thin Film Transistor>

Figure 21:
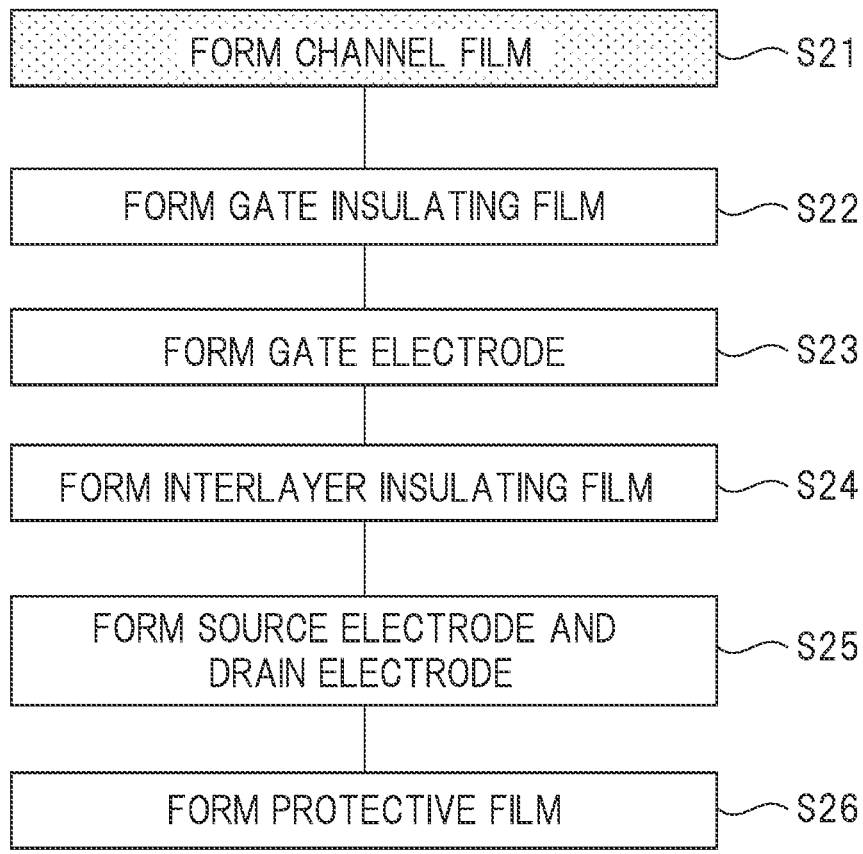
FIG. 21 is a flowchart showing a flow of a manufacturing process for the thin film transistor.

Next, a manufacturing process of the thin film transistor (46) will be described. FIG. 21 is a flowchart showing a flow of the manufacturing process of the thin film transistor.

First, for example, the channel film (51) is formed on a glass substrate (corresponding to the above-described substrate 3 and 50) which is a substrate made of glass (step S21 in FIG. 21). Next, the gate insulating film (52) is formed on the glass substrate (3, 50) so as to cover the channel film (51) (step S22 in FIG. 21). Next, the gate electrode (53) is formed on the gate insulating film (52) (step S23 in FIG. 21). After the gate electrode (53) is formed, impurities for the source and drain can be injected into the channel film (51). Next, the interlayer insulating film (54) is formed (step S24 in FIG. 21). Next, the through hole is formed in the interlayer insulating film (54) and the gate insulating film (52), and then the source electrode (55a) and the drain electrode (55b) are formed (step S25 in FIG. 21). Next, the protective film (56) is formed (step S26 in FIG. 21). In the above-described manner, the thin film transistor can be manufactured.

<Formation Process of Channel Film>

Figure 22:
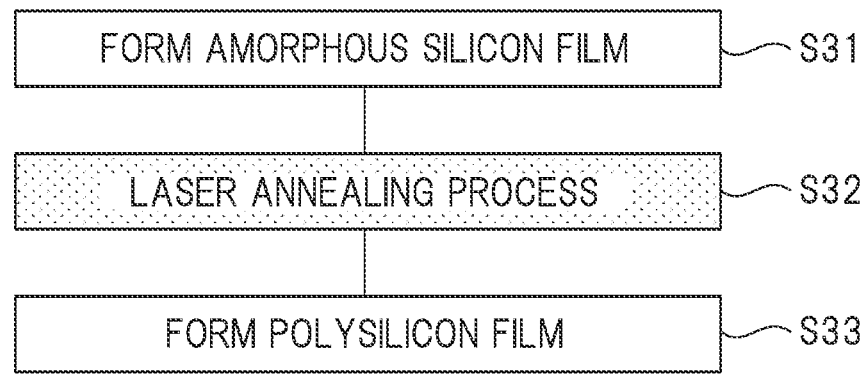
FIG. 22 is a flowchart describing a flow of a formation process of a channel film.

Here, details of a formation process of the channel film (51) will be described. FIG. 22 is a flowchart describing a flow of the formation process of the channel film.

First, an amorphous silicon film is formed on the glass substrate (3, 50) (step S31 in FIG. 22). Then, the laser beam (20a) is irradiated onto the amorphous silicon film, and then the laser annealing process is performed (step S32 in FIG. 22). This allows the amorphous silicon film to be heated, and as a result, a polycrystalline silicon film is formed from the amorphous silicon film (step S33 in FIG. 22). Namely, the amorphous silicon film is changed (transformed) into a polycrystalline silicon film. In the above-described manner, the channel film (51) made of the polycrystalline silicon film can be formed. In addition, after the laser annealing process, the channel film (51) made of the polycrystalline silicon film can be patterned into a predetermined shape by using a photolithography technique and an etching technique.

Since the channel film acts as a pathway for electrons, properties of the channel film affect the performance of the thin film transistor. Since polycrystalline silicon has a higher mobility than amorphous silicon, the performance of the thin film transistor can be enhanced by forming the channel film with a polycrystalline silicon film. For this reason, in the present embodiment, the channel film is constituted by a polycrystalline silicon film. Specifically, as described above, the amorphous silicon film is changed into the polycrystalline silicon film by forming the amorphous silicon film, and then performing the laser annealing process on the amorphous silicon film. Therefore, in order to form the channel film from the polycrystalline silicon film, the laser annealing process (heating process) is necessary, and in order to perform the laser annealing process, the laser processing apparatus is necessary. In the present embodiment, the above-described laser processing apparatus 1 can be used to perform the laser annealing process.

In a case where the laser processing apparatus 1 of the present embodiment is used, the substrate 3 is moved (transported) in the horizontal direction while the substrate 3 is levitated on the stage 2, and the laser beam 20a is irradiated onto the moving substrate 3 (more specifically, the amorphous silicon film 3a on the substrate 3) to change the amorphous silicon film 3a formed on the substrate 3 into a polycrystalline silicon film. The polycrystalline silicon film corresponds to the above-described channel film (51). Since the stage 2 does not need to be moved when laser processing is performed on the plurality of substrates, processing time per substrate becomes shorter and the throughput becomes higher.

In addition, in the laser processing apparatus 1 of the present embodiment, since the upper structure 5a and the upper structure 5b are spaced apart from each other, and the focus point position of the laser beam 20a (laser beam irradiated region in the substrate 3) overlaps the gap (filling member 8) between the upper structure 5a and the upper structure 5b in plan view, it is possible to suppress or prevent deformation of the upper structures 5a and 5b by thermal distortion. As a result, it is possible to suppress or prevent variations in the height position of the substrate 3 that is moved while being levitated on the stage 2. In addition, in the laser processing apparatus 1 of the present embodiment, since the filling member 8 is arranged so as to fill the gap between the upper structure 5a and the upper structure 5b as described above, the problems described above with reference to FIGS. 9 to 11 can be improved or solved.

For this reason, by using the laser processing apparatus 1 of the present embodiment, it is possible to suppress or prevent variations in the laser processing conditions for the substrate (amorphous silicon film 3a). As a result, it is possible to suppress or prevent variations in the properties of the polycrystalline silicon film in a case where the amorphous silicon film 3a formed on the substrate 3 is changed into the polycrystalline silicon film by laser processing. For this reason, it is possible to suppress or prevent variations in the properties of the channel film (51) made of the polycrystalline silicon film, and thus, it is possible to suppress or prevent variations in the properties of the thin film transistor (46). Therefore, performance and reliability of the display apparatus having the thin film transistor (46) can be enhanced.

Modification Example

Next, a first modification example of the laser processing apparatus 1 of the present embodiment will be described.

Figure 23:
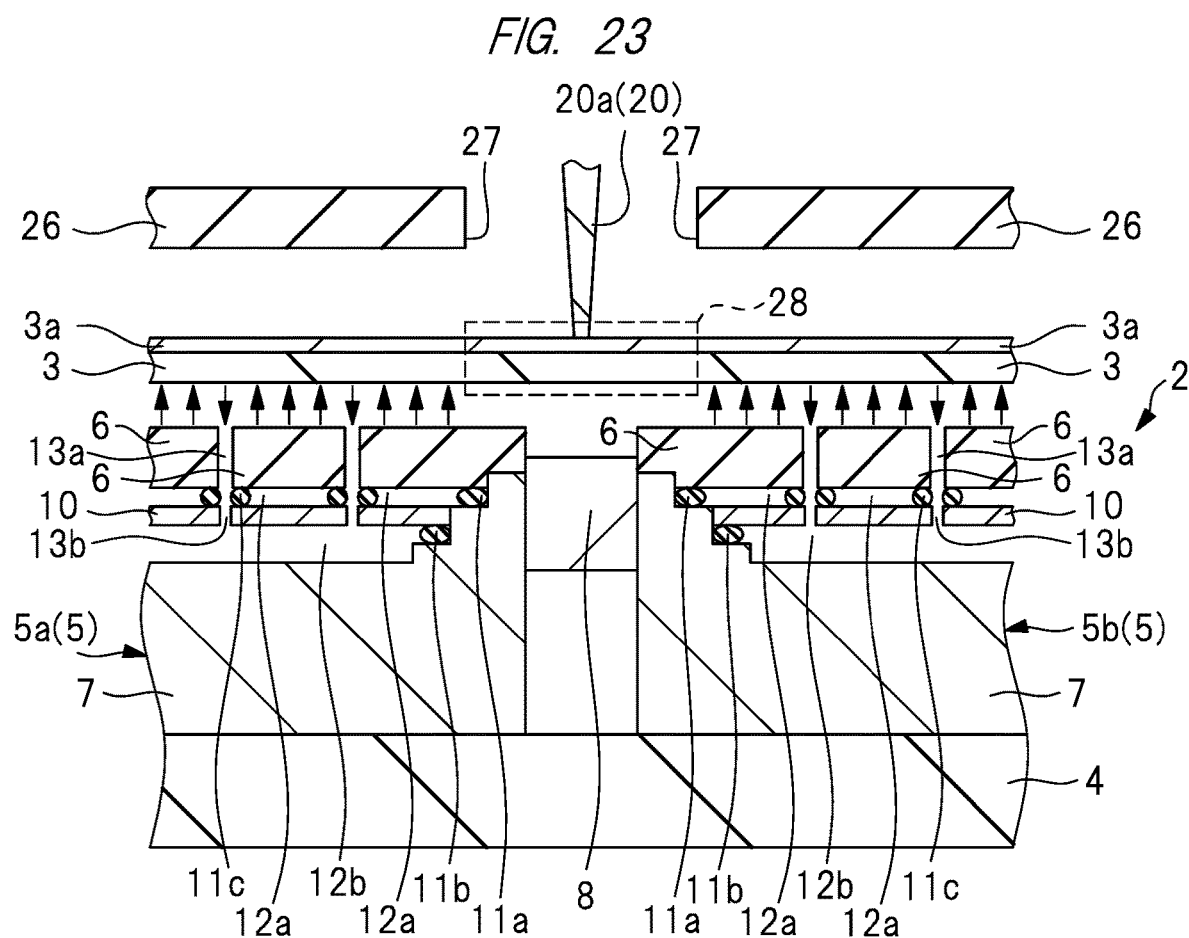
FIG. 23 is a plan view of a main portion of the laser processing apparatus of a first modification example.

FIG. 23 is a cross-sectional view of a main portion of the first modification example of the laser processing apparatus 1 of the present embodiment, and is a drawing corresponding to the above-described FIG. 4.

In the case of the above-described FIG. 4, the upper structures 5a and 5b and the filling member 8 arranged between the upper structures 5a and 5b are arranged on the upper surface of the surface plate 4, and each of the lower surfaces of the upper structures 5a and 5b and the filling member 8 is in contact with the upper surface of the surface plate 4.

In contrast, in the case of FIG. 23 (first modification example), the lower surface of the filling member 8 is located away from the upper surface of the surface plate 4 at a predetermined distance, and a predetermined space in which the filling member 8 is not present is present between the filling member 8 arranged between the upper structures 5a and 5b and the upper surface of the surface plate 4. Namely, the height positions of the upper surfaces of the upper structures 5a and 5b and the filling member 8 are the same in the case of FIG. 4 and in the case of FIG. 23. However, the dimension of the filling member 8 in a height direction (Z direction) in FIG. 23 is smaller than that of the filling member 8 in FIG. 4, and thus, the height position of the lower surface of the filling member 8 in FIG. 23 is higher than that of the filling member 8 in FIG. 4.

In the case of FIG. 23 (first modification example), the filling member 8 acts to prevent the inert gas jetted from the opening 27 in the sealing box 26 from flowing to a side lower than the filling member 8 between the upper structure 5a and the upper structure 5b. Namely, in the case of FIG. 23 (first modification example), since the filling member 8 is present between the upper structure 5a and the upper structure 5b, the inert gas jetted from the opening 27 in the sealing box 26 does not flow below the filling member 8 (more specifically, below the upper surface of the filling member 8). For this reason, even if there is a space between the upper structure 5a and the upper structure 5b in which the filling member 8 is not present between the filling member 8 and the surface plate 4, the flow of the inert gas jetted from the opening 27 in the sealing box 26 is not affected. In the case of FIG. 23 (first modification example), it is preferable that the filling member 8 is in contact with the upper structures 5a and 5b, and thus, it is preferable that the side surface of the filling member 8 (side surface on the side facing the upper structure 5a) is in contact with the side surface of the upper structure 5a (side surface on the side facing the filling member 8), and that the other side surface of the filling member 8 (side surface on the side facing the upper structure 5b) is in contact with the side surface of the upper structure 5b (side surface on the side facing the filling member 8).

In addition, as a further modification example, there may be a case where the filling member 8 is present not only between the upper structures 5a and 5b but also below the upper structures 5a and 5b (that is, between the upper structures 5a and 5b and the surface plate 4). In this case, the filling member 8 extends from between the upper structure 5a and the upper structure 5b to between the upper structures 5a and 5b and the surface plate 4. In any case, the filling member 8 is partially arranged (sandwiched) between the upper structures 5a and 5b.

Next, a second modification example of the laser processing apparatus 1 of the present embodiment will be described.

Figure 24:
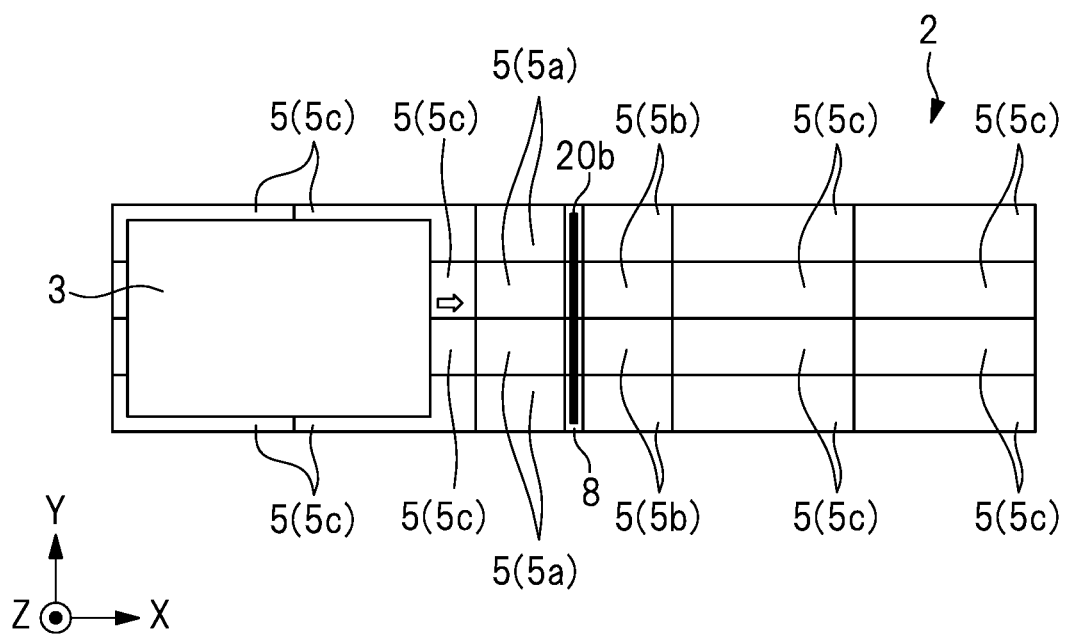
FIG. 24 is a plan view showing a stage of the laser processing apparatus of a second modification example.
Figure 25:
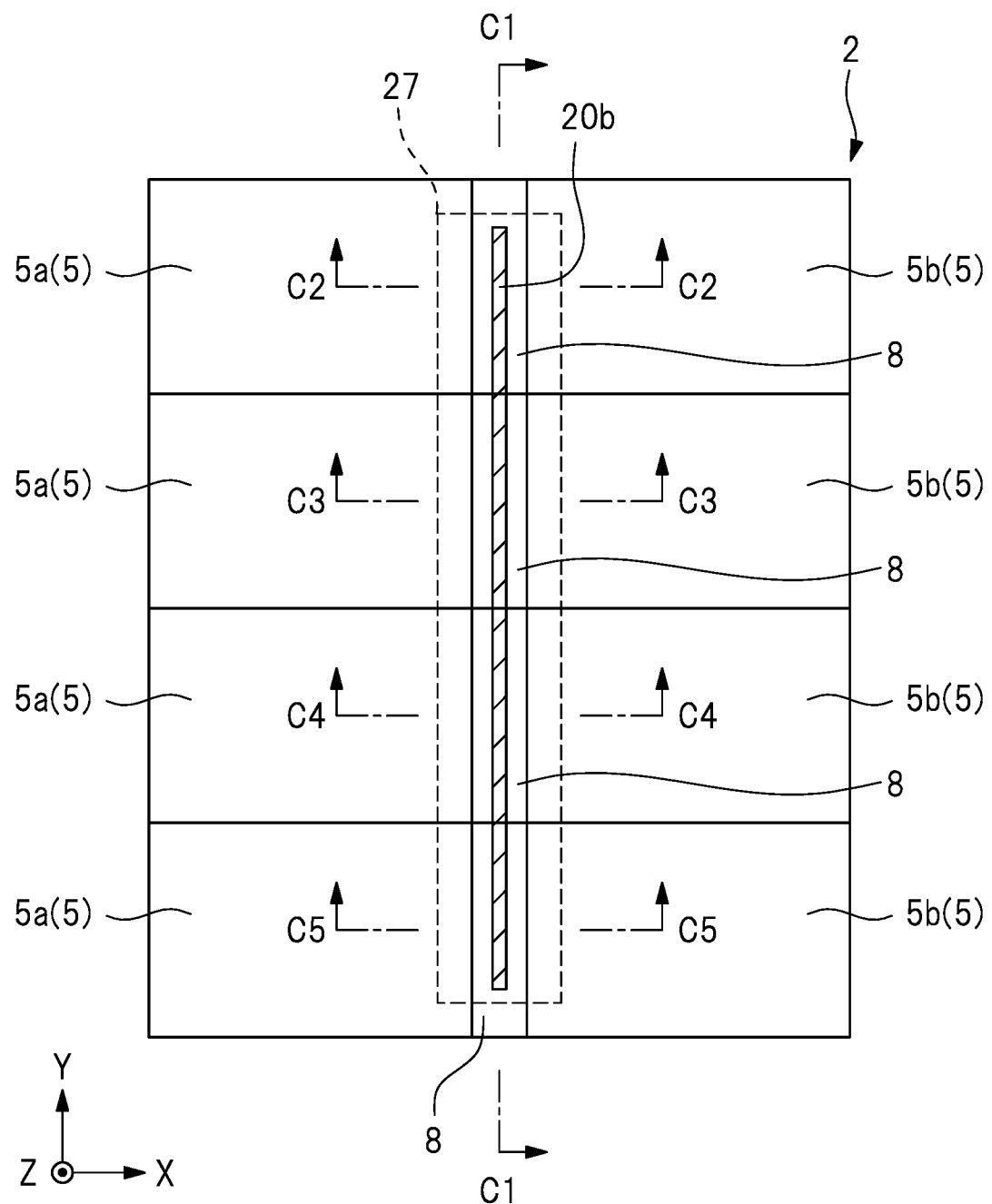
FIG. 25 is a plan view of a main portion of the laser processing apparatus of the second modification example.
Figure 26:
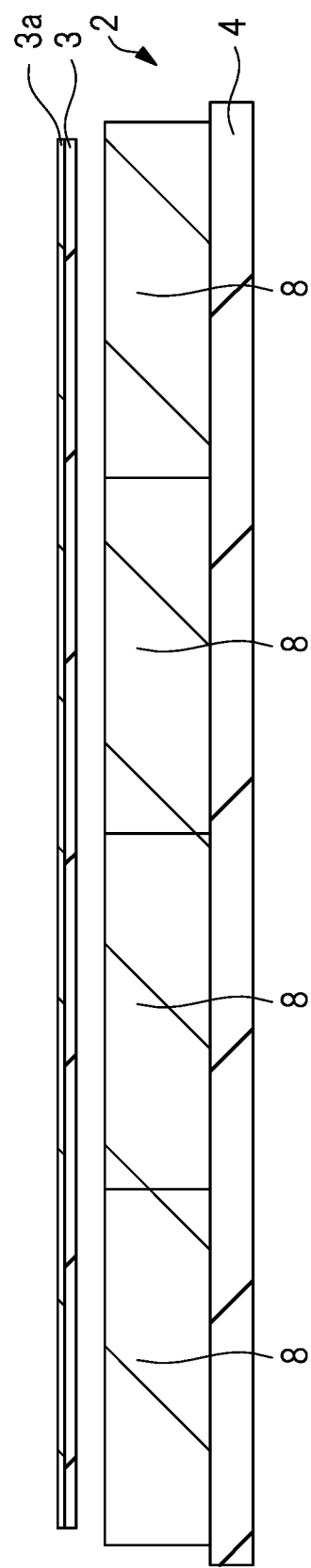
FIG. 26 is a cross-sectional view of a main portion of the laser processing apparatus of the second modification example.

FIG. 24 is a plan view showing the stage 2 of the laser processing apparatus 1 of the second modification example, FIG. 25 is a plan view of a main portion of the laser processing apparatus 1 of the second modification example, and FIG. 26 is a cross-sectional view of a main portion of the laser processing apparatus 1 of the second modification example. FIG. 24 shows a plan view corresponding to (a) of the above-described FIG. 2. FIG. 25 is a partially enlarged plan view showing an enlarged portion of FIG. 24, and corresponds to the above-described FIG. 3. In FIG. 25, the laser beam irradiated region 20b is indicated by hatched lines. FIG. 26 substantially corresponds to a cross-sectional view taken at a position of a line C1-C1 shown in FIG. 25. Since a cross-sectional view taken at a position of a line C2-C2, a cross-sectional view taken at a position of a line C3-C3, a cross-sectional view taken at a position of a line C4-C4 and a cross-sectional view taken at a position of a line C5-C5 shown in FIG. 26 are all substantially the same as FIG. 4, redundant descriptions thereof are omitted here.

In the case of the above-described FIG. 2, the dimension of each of the upper structures 5a, 5b and 5c in the Y direction is approximately the same as or larger than a dimension of the substrate 3 in the Y direction, the substrate 3 is moved in the X direction while being levitated on the pair of upper structures 5a and 5b adjacent to each other in the X direction, and the laser beam 20a is irradiated onto the moving substrate 3 (more specifically, the amorphous silicon film 3a on the substrate 3). Then, the filling member 8 described above in the first embodiment is arranged between the upper structures 5a and 5b adjacent to each other in the X direction.

In contrast, in the case of FIGS. 24 to 26 (second modification example), the dimension of each of the upper structures 5a, 5b and 5c in the Y direction is smaller than the dimension of the substrate 3 in the Y direction. Then, a plurality of pairs of upper structures 5a and 5b adjacent to each other in the X direction and sandwiching the filling member 8 are arranged side by side in the Y direction. Since the above-described filling member 8 is arranged between the upper structures 5a and 5b adjacent to each other in the X direction, and corresponding to the fact that the plurality of pairs of upper structures 5a and 5b are aligned in the Y direction, the plurality of filling members 8 between the upper structures 5a and 5b are also aligned in the Y direction. In other words, in the case of FIGS. 24 to 26, the upper structure 5a, the upper structure 5b and the filling member 8 between the upper structure 5a and the upper structure 5b constitute one set, and a plurality of such sets are aligned in the Y direction. Note that, FIGS. 24 to 26 show a case where four sets are aligned in the Y direction. However, the number of sets aligned in the Y direction is not limited to four sets. In addition, in the case of FIG. 24, since the dimensions in the Y direction of the upper structures 5a and 5b as well as the upper structures 5c other than the upper structures 5a and 5b are smaller than the dimension of the substrate 3 in the Y direction, the plurality of upper structures 5c are also aligned in the Y direction.

Since the structures of the upper structures 5a and 5b and the filling member 8 in the case of FIGS. 24 to 26 are basically the same as those described with reference to the above-described FIGS. 3 to 5, redundant descriptions there are omitted here.

In the case of FIGS. 24 to 26 (second modification example), since it is possible to make the dimension (plane area) of individual upper structures 5a, 5b and 5c smaller, it is easier to prepare the upper structures 5a, 5b and 5c and assemble the stage 2. For this reason, it is easier to manufacture the laser processing apparatus.

In addition, in the case of FIGS. 24 to 26 (second modification example), it is possible to integrate the plurality of filling members 8 aligned in the Y direction. In this case, the structure is such that the plurality of upper structures 5a are aligned on a side of one of the side surfaces of the common filling member 8 extending in the Y direction, and the plurality of upper structures 5b are aligned on a side of the other of the side surfaces of the common filling member 8. Namely, the structure is such that the plurality of pairs of upper structures 5a and 5b are aligned with the common filling member 8 extending in the Y direction sandwiched therebetween.

In addition, the filling member 8 in the case of the above-described FIG. 23 (first modification example) can also be applied to the case of FIGS. 24 to 26 (second modification example).

Figure 27:
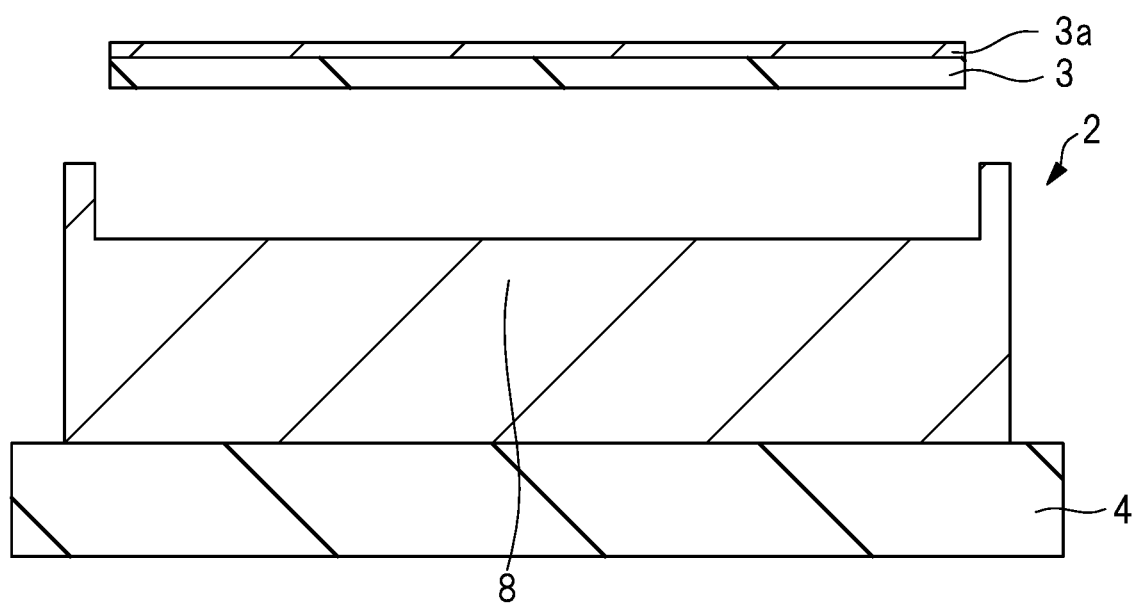
FIG. 27 is a cross-sectional view of a main portion of the laser processing apparatus of a third modification example.
Figure 28:
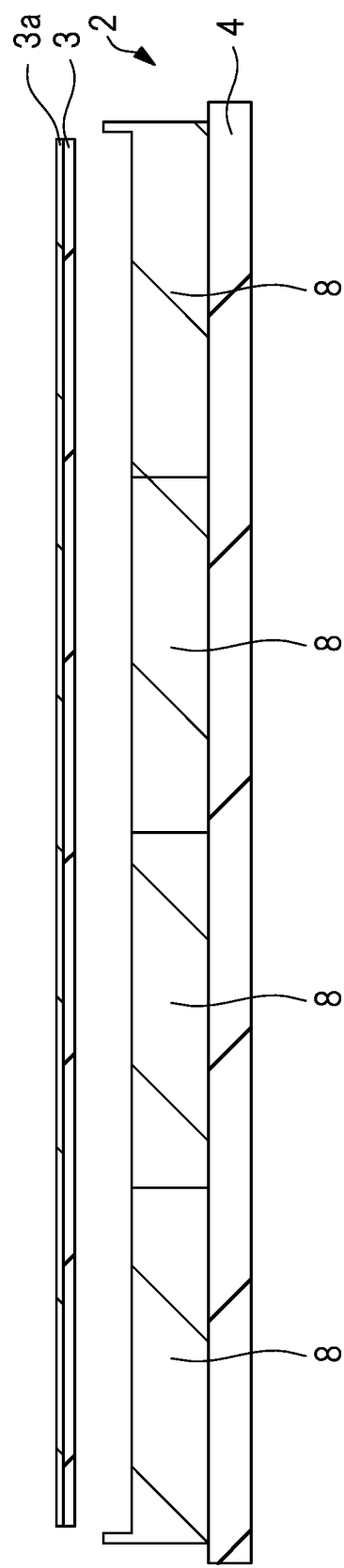
FIG. 28 is a cross-sectional view of a main portion of the laser processing apparatus of the third modification example.

Next, a third modification example of the laser processing apparatus 1 of the present embodiment will be described. There may be a case where the height of the filling member 8 (height position of the upper surface) is not constant. FIGS. 27 and 28 are cross-sectional views of a main portion of the laser processing apparatus 1 of the third modification example, and show an example in a case where the height of the filling member 8 is not constant. Note that FIG. 27 is a cross-sectional view corresponding to the above-described FIG. 5, and FIG. 28 is a cross-sectional view corresponding to the above-described FIG. 26. The plan view in a case where the cross section is that of FIG. 27 is substantially the same as in the above-described FIG. 3, and the plan view in a case where the cross section is that of FIG. 28 is substantially the same as in the above-described FIG. 25.

In the case of FIG. 27, the filling member 8 is arranged between the pair of upper structures 5a and 5b as in the case of the above-described FIGS. 3 to 5. In the case of the above-described FIG. 5, the height of the filling member 8 (height position of the upper surface) is substantially constant regardless of the position in the Y direction. However, in the case of FIG. 27, the height of the filling member 8 (height position of the upper surface) is not constant. Specifically, in the case of FIG. 27, the height of the filling member 8 (height position of the upper surface) is made higher at both end portions in the Y direction, and the height of the filling member 8 (height position of the upper surface) is made lower than both end portions at portions other than both end portions in the Y direction (that is, inside both end portions in the Y direction). Note that, when the substrate 3 is moved in the Y direction while being levitated, it is preferable that the region where the height of the filling member 8 is higher (both end portions in the Y direction) does not overlap the substrate 3 in plan view.

In addition, in the case of FIG. 28, corresponding to the fact that the plurality of pairs of upper structures 5a and 5b are aligned in the Y direction as in the case of the above-described FIGS. 25 and 26, the plurality of filling members 8 between the upper structures 5a and 5b are also aligned in the Y direction. Namely, in the case of FIG. 28, the upper structure 5a, the upper structure 5b and the filling member 8 between the upper structure 5a and the upper structure 5b constitute one set as in the case of the above-described FIGS. 25 and 26, and a plurality of such sets are aligned in the Y direction. In the case of the above-described FIG. 26, the height of the filling member 8 (height position of the upper surface) is substantially constant regardless of the position in the Y direction. However, in the case of FIG. 28, the height of the plurality of filling members 8 (height position of the upper surface) aligned in the Y direction is not constant. Specifically, in the case of FIG. 28, the height of the filling member 8 (height position of the upper surface) is made higher at both end portions in the Y direction across the entire plurality of filling members 8 aligned in the Y direction, and the height of the filling member 8 (height position of the upper surface) is made lower than both end portions at portions other than both end portions in the Y direction (that is, inside both end portions in the Y direction). Note that, when the substrate 3 is moved in the Y direction while being levitated, it is preferable that the region where the height of the filling member 8 is higher (both end portions in the Y direction) does not overlap the substrate 3 in plan view.

In the case of FIGS. 27 and 28, since the height of the filling member 8 (height position of the upper surface) is higher at both end portions in the Y direction, it is possible to obtain the effect of restricting the flow of the inert gas supplied from the opening 27 in the Y direction in the region (both end portions in the Y direction) that is higher than the height of the filling member 8. As a result, it is easier for the inert gas jetted from the opening 27 to spread horizontally (particularly in the X direction) on the upper surfaces of the upper structures 5a and 5b when the substrate 3 is not present above the gap between the upper structure 5a and the upper structure 5b.

Next, a fourth modification example of the laser processing apparatus 1 of the present embodiment will be described. The fourth modification example can be applied to the case of the above-described FIGS. 3 to 5, the case of the above-described FIG. 23 (first modification example), the case of FIGS. 24 to 26 (second modification example), and the case of FIGS. 27 and 28 (third modification example).

The fourth modification example corresponds to a case where the filling member 8 has a structure that can jet the gas from its upper surface. Inert gas represented by, for example, nitrogen gas can be used as the gas that is jetted from the upper surface of the filling member 8.

In the case of the fourth modification example, since it is possible to obtain the effect of restricting the flow (downward flow) of the inert gas jetted from the opening 27 in the sealing box 26 by the gas jetted from the upper surface of the filling member 8, it is further easier for the inert gas jetted from the opening 27 to spread horizontally (particularly in the X direction) on the upper surfaces of the upper structures 5a and 5b when the substrate 3 is not present above the gap between the upper structure 5a and the upper structure 5b.

On the other hand, in a case where the filling member 8 does not have a structure that can jet the gas from its upper surface, that is, in a case where the gas is not jetted from the upper surface of the filling member 8, the gas jetted from the upper surface of the filling member 8 does not hit the substrate 3. As a result, since the substrate 3 is not affected by the gas jetted from the upper surface of the filling member 8, the height position of the substrate 3 at the position where the laser beam 20a is irradiated can be precisely controlled by the jetting and sucking of the gas from the upper surfaces of the upper structures 5a and 5b. For this reason, it is easier to control the laser processing conditions.

In the foregoing, the invention made by the present inventors has been concretely described based on the embodiments. However, it goes without saying that the present invention is not limited to the foregoing embodiments, and various modifications can be made within the scope of the present invention.

LIST OF REFERENCE SIGNS 1, 101 laser processing apparatus
2, 102, 202 stage
3, 103 substrate
3a, 103a amorphous silicon film
4 surface plate
5, 5a, 5b, 5c upper structure
6 surface-side member
7 base portion
8 filling member
10 intermediate plate
11a, 11b, 11c adhesive layer
12a, 12b space
13a, 13b through hole
20, 20a laser beam
20b laser beam irradiated region
21 laser beam generator
22 optical attenuator
23 optical system module
23a reflecting mirror
23b sealing window
24 sealed housing
24a sealing window
25 processing chamber
26 sealing box
27 opening
28 substrate-heated region
31 large-screen television
32 smartphone
40 pixels
41 pixel portion
42 scanning line drive circuit
43 signal line drive circuit
44, 45, 45A wiring
46 thin film transistor
47 liquid crystal element
50 substrate
51 channel film
52 gate insulating film
53 gate electrode
54 interlayer insulating film
55a source electrode
55b drain electrode
56 protective film

The invention claimed is:

1. A laser processing apparatus comprising:
a stage having a front surface and a back surface on an opposite side of the front surface, and being capable of levitating and transporting a substrate by jetting gas from the front surface;
a laser oscillator configured to irradiate a laser beam onto the substrate; and
a gas jetting port arranged above the stage and at a position overlapping a focus point position of the laser beam in plan view, and being configured to jet inert gas,
wherein the front surface of the stage is constituted by a first upper structure and a second upper structure,
the first upper structure and the second upper structure are arranged so as to be spaced apart from each other and face each other,
a gap between the first upper structure and the second upper structure overlaps the focus point position of the laser beam in plan view, and
a filling member is arranged so as to fill the gap between the first upper structure and the second upper structure.

2. The laser processing apparatus according to claim 1, wherein the inert gas jetted from the gas jetting port does not flow below the filling member.

3. The laser processing apparatus according to claim 1, wherein an upper surface of the filling member is located at a position lower than an upper surface of each of the first upper structure and the second upper structure.

4. The laser processing apparatus according to claim 3, wherein a height of the upper surface of the first upper structure is the same as a height of the upper surface of the second upper structure.

5. The laser processing apparatus according to claim 1, wherein a planar shape of the laser beam on the front surface of the stage has a rectangular shape having a long axis and a short axis, and
the filling member is arranged along a direction of the long axis.

6. The laser processing apparatus according to claim 1, wherein the substrate is a glass substrate.

7. The laser processing apparatus according to claim 1, wherein an amorphous semiconductor film is formed on the substrate, and the amorphous semiconductor film is transformed into a polycrystalline semiconductor film by irradiation of the laser beam.

8. The laser processing apparatus according to claim 1, wherein the first upper structure has a first surface-side member configured to jet the gas,
the second upper structure has a second surface-side member configured to jet the gas, and
the filling member does not jet the gas.

9. The laser processing apparatus according to claim 8, wherein the first surface-side member and the second surface-side member are each made of a porous body.

10. The laser processing apparatus according to claim 1, wherein the laser beam passes through the gas jetting port and is irradiated onto the substrate.

11. The laser processing apparatus according to claim 1, wherein the substrate is transported while being levitated on the stage, the inert gas is jetted from the gas jetting port, and the laser beam is irradiated onto the substrate.

12. The laser processing apparatus according to claim 1, wherein the laser beam is irradiated onto the substrate in an atmosphere of the inert gas jetted from the gas jetting port.

\* \* \* \* \*